United States Patent
Kamei

(10) Patent No.: US 7,352,628 B2
(45) Date of Patent: Apr. 1, 2008

(54) SYSTEMS FOR PROGRAMMING DIFFERENTLY SIZED MARGINS AND SENSING WITH COMPENSATIONS AT SELECT STATES FOR IMPROVED READ OPERATIONS IN A NON-VOLATILE MEMORY

(75) Inventor: Teruhiko Kamei, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 10 days.

(21) Appl. No.: 11/425,116

(22) Filed: Jun. 19, 2006

(65) Prior Publication Data

US 2007/0291546 A1 Dec. 20, 2007

(51) Int. Cl.
*G11C 16/06* (2006.01)
*G11C 16/04* (2006.01)

(52) U.S. Cl. .................. 365/185.2; 365/185.03; 365/185.17; 365/185.18; 365/185.21; 365/185.22; 365/185.23

(58) Field of Classification Search ........... 365/185.03, 365/185.18, 185.2, 185.21, 185.22, 185.24
See application file for complete search history.

(56) References Cited

U.S. PATENT DOCUMENTS

| | | | |
|---|---|---|---|
| 5,532,962 A | 7/1996 | Auclair et al. | |
| 5,764,572 A | 6/1998 | Hammick | |
| 5,867,429 A | 2/1999 | Chen et al. | |
| 6,046,935 A | 4/2000 | Takeuchi et al. | |
| 6,222,762 B1 | 4/2001 | Guterman et al. | |
| 6,259,632 B1 | 7/2001 | Khouri et al. | |
| 6,377,507 B1 | 4/2002 | Tsao | |
| 6,522,580 B2 | 2/2003 | Chen et al. | |
| 6,535,423 B2 | 3/2003 | Trivedi et al. | |
| 6,542,407 B1 | 4/2003 | Chen et al. | |
| 6,570,790 B1 | 5/2003 | Harari | |

(Continued)

FOREIGN PATENT DOCUMENTS

EP 01271553 1/2003

(Continued)

OTHER PUBLICATIONS

Kamei, Teruhiko, "Programming Differently Sized Margins and Sensing with Compensations at Select States for Improved Read Operations in Non-Volatile Memory," U.S. Appl. No. 11/425,111, filed Jun. 19, 2006.

*Primary Examiner*—Huan Hoang
*Assistant Examiner*—Ly Duy Pham
(74) *Attorney, Agent, or Firm*—Vierra Magen Marcus & DeNiro LLP

(57) ABSTRACT

Non-volatile memory read operations compensate for floating gate coupling when the apparent threshold voltage of a memory cell may have shifted. A memory cell of interest can be read using a reference value based on a level of charge read from a neighboring memory cell. Misreading the neighboring cell may have greater effects in particular programming methodologies, and more specifically, when reading the neighboring cell for particular states or charge levels in those methodologies. In one embodiment, memory cells are programmed to create a wider margin between particular states where misreading a neighboring cell is more detrimental. Further, memory cells are read in one embodiment by compensating for floating gate coupling based on the state of a neighboring cell when reading at certain reference levels but not when reading at other reference levels, such as those where a wider margin has been created.

13 Claims, 16 Drawing Sheets

U.S. PATENT DOCUMENTS

| | | |
|---|---|---|
| 6,594,181 B1 | 7/2003 | Yamada |
| 6,643,188 B2 | 11/2003 | Tanaka et al. |
| 6,657,891 B1 | 12/2003 | Shibata et al. |
| 6,717,847 B2 | 4/2004 | Chen |
| 6,771,536 B2 | 8/2004 | Li et al. |
| 6,781,877 B2 | 8/2004 | Cernea et al. |
| 6,785,169 B1 | 8/2004 | Nemati et al. |
| 6,798,698 B2 | 9/2004 | Tanaka et al. |
| 6,807,095 B2 | 10/2004 | Chen et al. |
| 6,870,766 B2 * | 3/2005 | Cho et al. .............. 365/185.03 |
| 6,870,768 B2 | 3/2005 | Cernea et al. |
| 6,888,758 B1 | 5/2005 | Hemink et al. |
| 6,956,770 B2 | 10/2005 | Khalid et al. |
| 7,012,835 B2 | 3/2006 | Gonzalez et al. |
| 7,020,017 B2 | 3/2006 | Chen et al. |
| 7,031,214 B2 | 4/2006 | Tran |
| 7,057,935 B2 * | 6/2006 | Chevallier ............. 365/185.22 |
| 7,057,936 B2 | 6/2006 | Yaegashi et al. |
| 7,099,194 B2 | 8/2006 | Tu et al. |
| 7,173,859 B2 | 2/2007 | Hemink |
| 7,187,585 B2 | 3/2007 | Li et al. |
| 7,187,592 B2 * | 3/2007 | Guterman et al. ..... 365/189.01 |
| 7,196,928 B2 | 3/2007 | Chen |
| 7,196,946 B2 | 3/2007 | Chen et al. |
| 2003/0137888 A1 | 7/2003 | Chen |
| 2003/0161182 A1 | 8/2003 | Li et al. |
| 2004/0047182 A1 | 3/2004 | Cernea et al. |
| 2004/0057283 A1 | 3/2004 | Cernea |
| 2004/0057285 A1 | 3/2004 | Cernea et al. |
| 2004/0057287 A1 | 3/2004 | Cernea et al. |
| 2004/0057318 A1 | 3/2004 | Cernea et al. |
| 2004/0060031 A1 | 3/2004 | Cernea |
| 2004/0109357 A1 | 6/2004 | Cernea et al. |
| 2004/0213031 A1 | 10/2004 | Koji |
| 2005/0162913 A1 | 7/2005 | Chen |

FOREIGN PATENT DOCUMENTS

| | | |
|---|---|---|
| EP | 01329898 | 1/2003 |

* cited by examiner

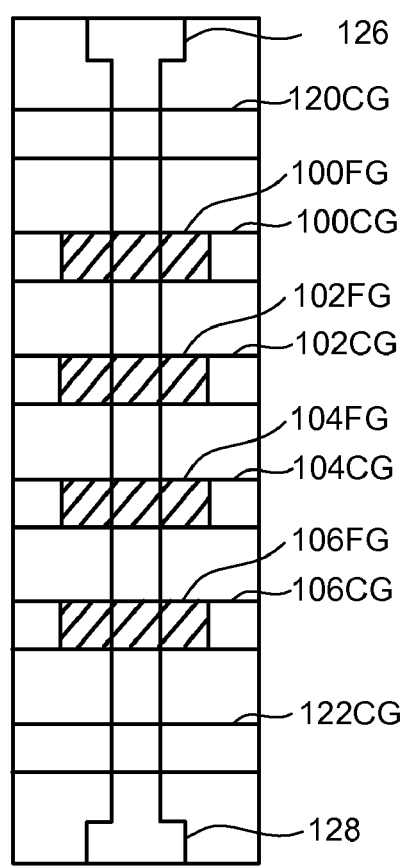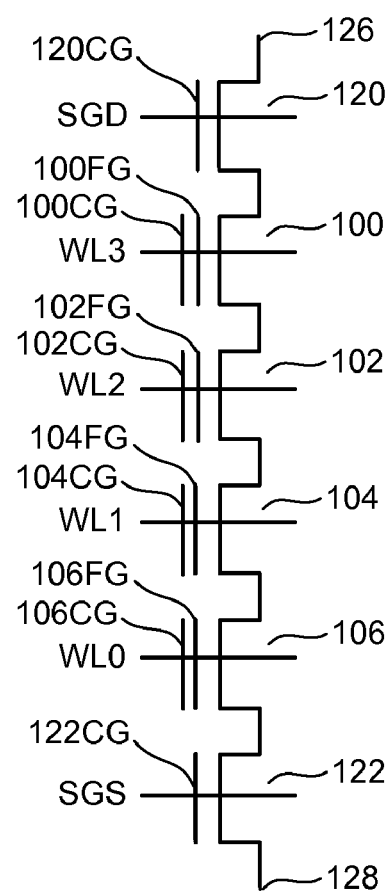
Fig. 1
Fig. 2

Fig. 9A (WLn+1)
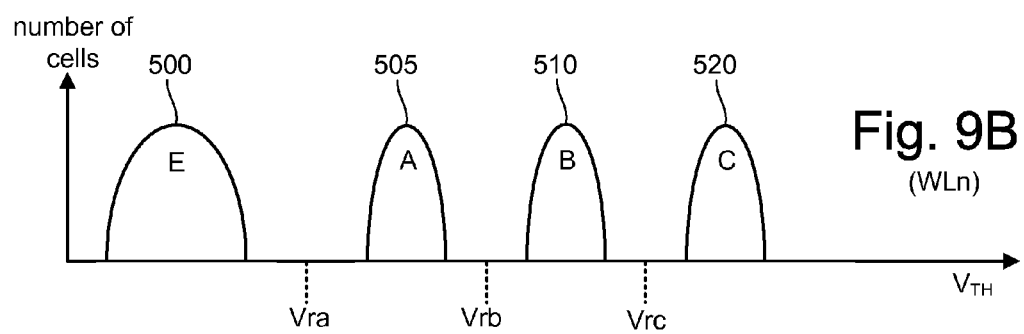
Fig. 9B (WLn)
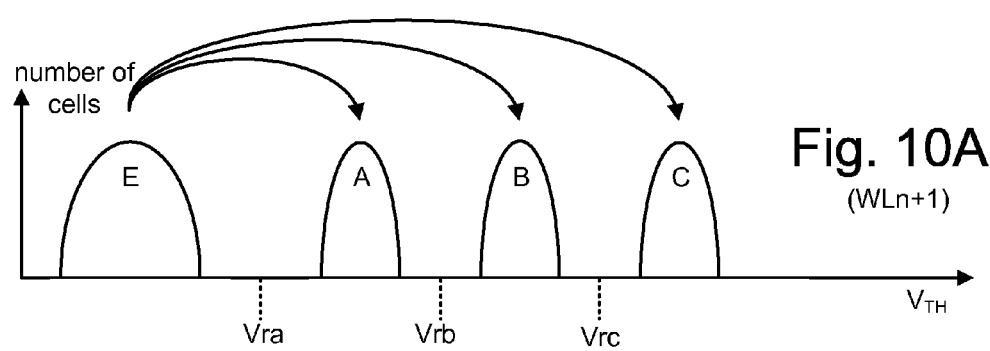
Fig. 10A (WLn+1)
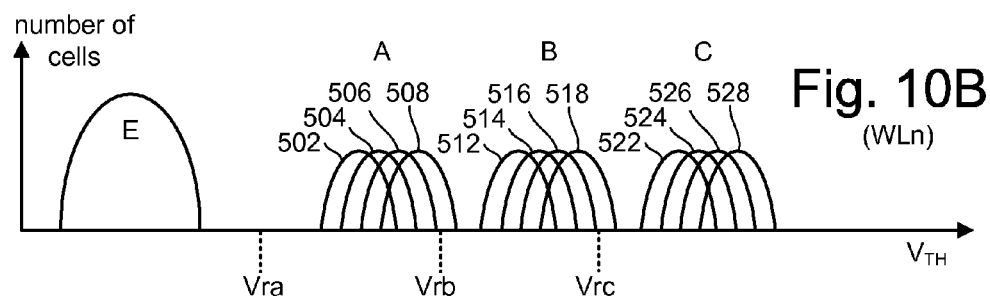
Fig. 10B (WLn)

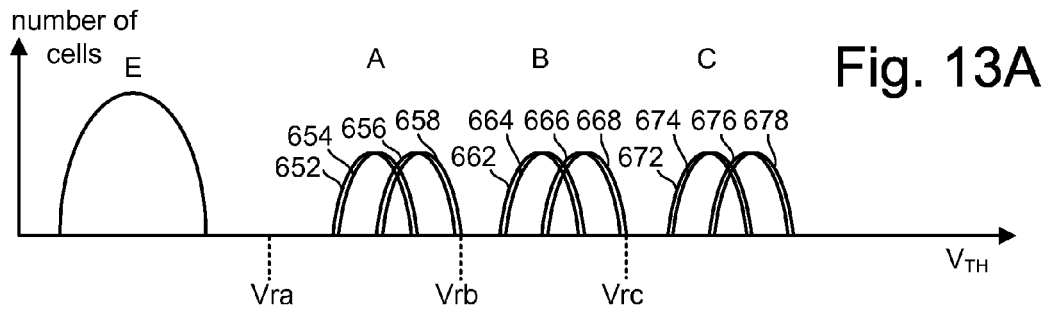
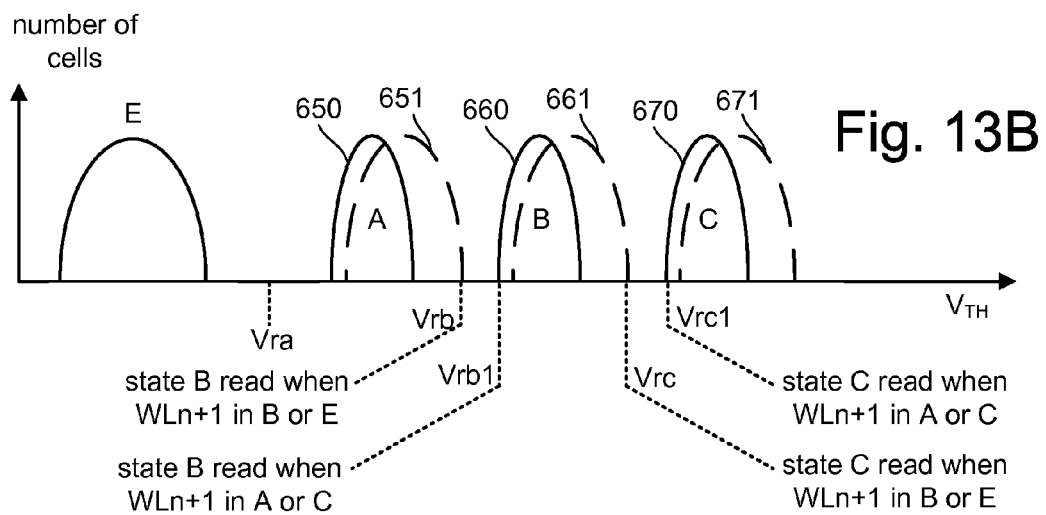
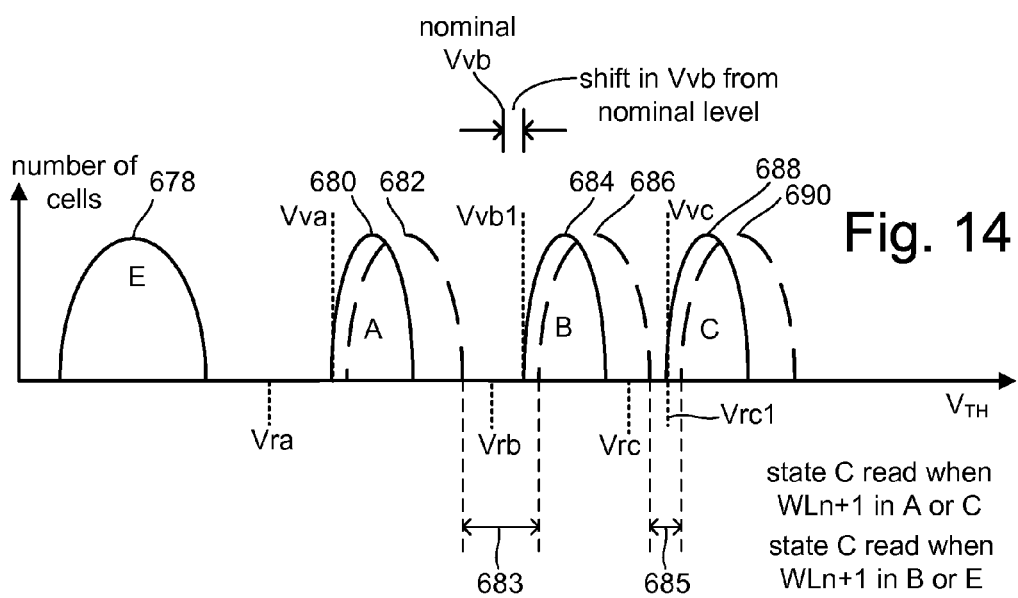

SYSTEMS FOR PROGRAMMING DIFFERENTLY SIZED MARGINS AND SENSING WITH COMPENSATIONS AT SELECT STATES FOR IMPROVED READ OPERATIONS IN A NON-VOLATILE MEMORY

BACKGROUND OF THE INVENTION

1. Field of the Invention

The present invention relates to programming non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM), including flash EEPROM, and Electronically Programmable Read Only Memory (EPROM) are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG via selection line SGD. Select gate 122 is controlled by applying the appropriate voltages to control gate 122CG via selection line SGS. Each of the transistors 100, 102, 104 and 106 includes a control gate and a floating gate, forming the gate elements of a memory cell. For example, transistor 100 includes control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 3 shows three NAND strings 202, 204 and 206 of a memory array having many more NAND strings. Each of the NAND strings of FIG. 3 includes two select transistors or gates and four memory cells. For example, NAND string 202 includes select transistors 220 and 230, and memory cells 222, 224, 226 and 228. NAND string 204 includes select transistors 240 and 250, and memory cells 242, 244, 246 and 248. Each string is connected to the source line by one select gate (e.g. select gate 230 and select gate 250). A selection line SGS is used to control the source side select gates. The various NAND strings are connected to respective bit lines by select gates 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, a bit line and respective NAND string comprise a column of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Relevant examples of NAND type flash memories and their operation are provided in the following U.S. Patents/Patent Applications, all of which are incorporated herein by reference: U.S. Pat. No. 5,570,315; U.S. Pat. No. 5,774,397, U.S. Pat. No. 6,046,935, U.S. Pat. No. 6,456,528 and U.S. Pat. Application. Ser. No. 09/893,277 (Publication No. US2003/0002348).

Each memory cell can store data (analog or digital). When storing one bit of digital data, the range of possible threshold voltages of the memory cell, typically referred to as a binary memory cell, is divided into two ranges which are assigned logical data "1" and "0." In one example of a NAND type flash memory, the threshold voltage is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored. A multi-state memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11." Three different positive threshold voltages are used for the states of "10", "01", and "00." The specific relationship between the data programmed into the memory cell and the threshold voltage ranges of the cell depends upon the data encoding scheme adopted for the memory cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. Additionally, embodiments in accordance with the present disclosure are applicable to memory cells that store more than two bits of data.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. The floating gate charge and threshold voltage of the cell can be indicative of a particular state corresponding to stored data. More information about programming can be found in U.S. patent application Ser. No. 10/379,608, titled "Self Boosting Technique," filed on Mar. 5, 2003; and in U.S. patent application Ser. No. 10/629,068, titled "Detecting Over Programmed Memory," filed on Jul. 29, 2003, both applications are incorporated herein by reference in their entirety.

Shifts in the apparent charge stored on a floating gate can occur because of coupling of an electric field based on the charge stored in neighboring floating gates. This floating gate to floating gate coupling phenomena is described in U.S. Pat. No. 5,867,429, which is incorporated herein by reference in its entirety. The floating gate to floating gate coupling phenomena occurs most pronouncedly, although not exclusively, between sets of adjacent memory cells that have been programmed at different times. For example, a first memory cell can be programmed to add a level of charge to its floating gate that corresponds to a set of data. Subsequently, one or more adjacent memory cells are programmed to add a level of charge to their floating gates that correspond to a set of data. After one or more of the adjacent memory cells are programmed, the charge level read from the first memory cell may appear to be different than when it was programmed because of the effect of the charge on the adjacent memory cell(s) being coupled to the first memory cell. The coupling from adjacent memory cells can shift the apparent charge level being read from a selected memory cell by a sufficient amount to lead to an erroneous reading of the stored data.

As memory cells continue to shrink in size, the natural programmed and erase distributions of threshold voltages are expected to increase due to short channel effects, greater oxide thickness/coupling ratio variations and more channel dopant fluctuations, reducing the available separation between adjacent states. This effect is much more significant for multi-state memories than binary memories using only two states. The reduction of the space between word lines and between bit lines will also increase the coupling between adjacent floating gates. The effect of the floating gate to floating gate coupling is of greater concern for multi-state devices because in multi-state devices the allowed threshold voltage ranges and the forbidden ranges (range between two distinct threshold voltage ranges that represent distinct memory states) are narrower than in binary devices. Therefore, floating gate to floating gate coupling can result in memory cells being shifted from an allowed threshold voltage range to a forbidden range.

Thus, there is a need to have a non-volatile memory that effectively manages the aforementioned problems of floating gate coupling.

SUMMARY OF THE INVENTION

The technology described herein attempts to address the effects of floating gate coupling in non-volatile memory.

Non-volatile memory read operations can compensate for floating gate coupling when the apparent threshold voltage of a memory cell may have shifted. A memory cell of interest can be read using a reference value based on a level of charge read from a neighboring memory cell. Misreading the neighboring cell may have greater effects in particular programming methodologies, and more specifically, when reading the neighboring cell for particular states or charge levels in those methodologies. In one embodiment, memory cells are programmed to create a wider margin between particular states where misreading a neighboring cell is more detrimental. Further, memory cells are read in one embodiment by compensating for floating gate coupling based on the state of a neighboring cell when reading at certain reference levels but not when reading at other reference levels, such as those where a wider margin has been created.

In one embodiment, a method of reading non-volatile storage is provided that in response to receiving a request to read a first non-volatile storage element, reads a second non-volatile storage element adjacent the first non-volatile storage element. A first reference is applied to read the first non-volatile storage element at a level between a first programmed state and a second programmed state, and a second reference is applied to read the first non-volatile storage element at a level between the second programmed state and the third programmed state. Data of the first non-volatile storage element is determined using a result of applying the first reference at a first level and a result of applying the second reference at a second level when the second non-volatile storage element is in a first subset of the physical states. When the second non-volatile storage element is in a second subset of the physical states, determining data of the first non-volatile storage element uses a result of applying the first reference at the first level and a result of applying the second reference at a third level.

A non-volatile memory system is provided in one embodiment that includes a first group of memory cells from a set of memory cells that are programmed together, a second group of memory cells from the set, and a third group of memory cells from the set. The first group is programmed to a first programmed state associated with a first range of threshold voltages and the second group of is programmed to a second programmed state associated with a second range of threshold voltages. The first and second ranges of threshold voltages define a first margin of a first size between the first programmed state and the second programmed state. The third group is programmed to a third programmed state associated with a third range of threshold voltages. The second and third ranges of threshold voltages define a second margin between the second programmed state and the third programmed state of a second size smaller than the first size.

Other features, aspects, and objects of embodiments of the disclosed technology can be obtained from a review of the specification, the figures, and the claims.

BRIEF DESCRIPTION OF THE DRAWINGS

FIG. 1 is a top view of a NAND string.

FIG. 2 is an equivalent circuit diagram of the NAND string of FIG. 1.

FIG. 9A depicts exemplary threshold voltage distributions for a group of memory cells connected to a first word line before being programmed.

FIG. 9B depicts exemplary threshold voltage distributions for a group of memory cells connected to a second word line adjacent the first word line of FIG. 9A after being programmed.

FIG. 10A depicts the threshold voltage distributions for the group of memory cells of FIG. 9A after being programmed.

FIG. 10B depicts the threshold voltage distributions for the group of memory cells of FIG. 9B after programming the group of memory cells depicted in FIG. 10A.

FIGS. 13A-13B depict the effects of floating gate coupling for memory cells programmed according to the process of FIGS. 12A-12C and exemplary read reference voltages that are used to compensate for the floating gate coupling.

FIG. 14 illustrates a programming and reading technique in accordance with one embodiment and the threshold voltage distributions of a group of memory cells programmed according to the programming technique.

DETAILED DESCRIPTION

Figure 4:
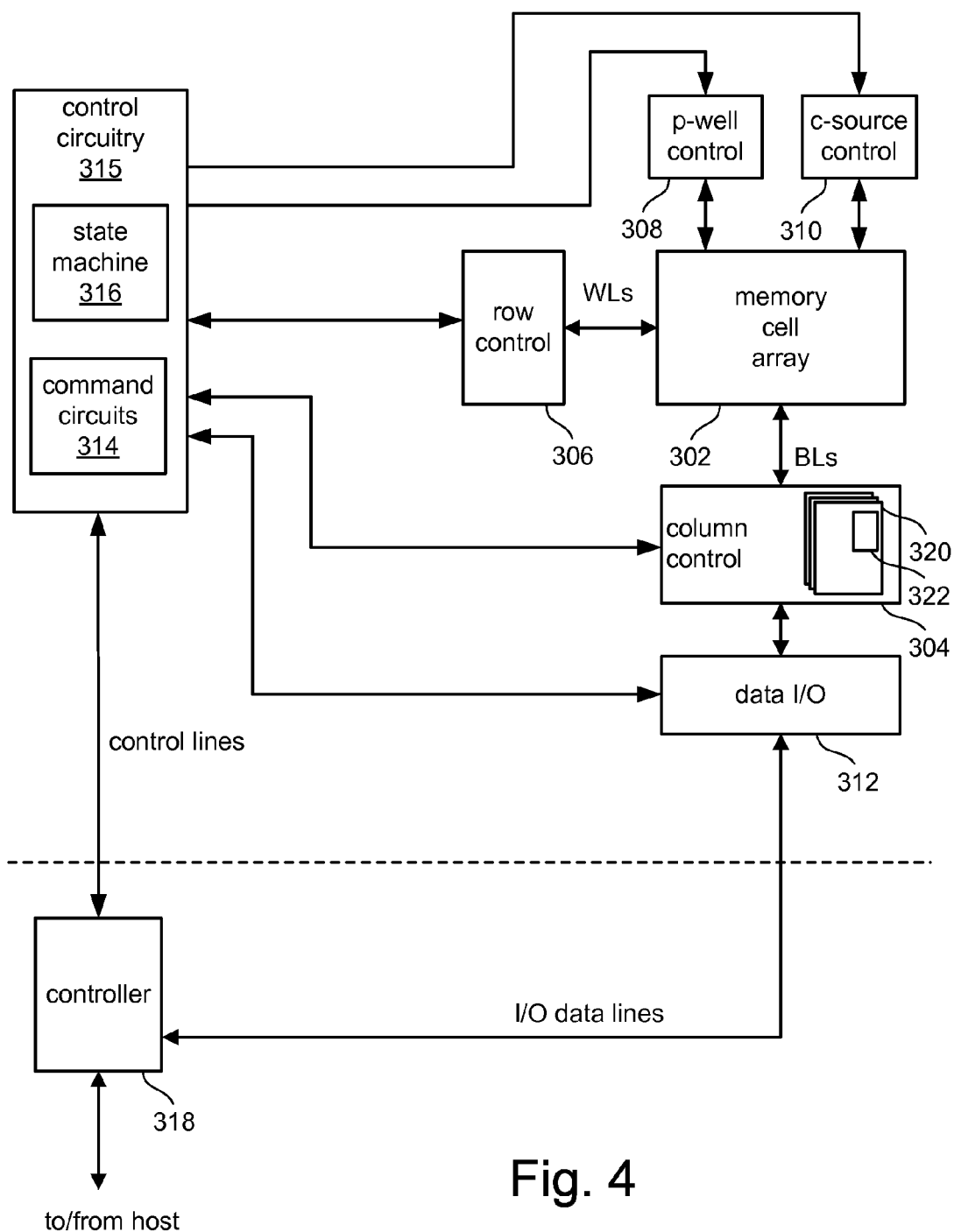
FIG. 4 is a block diagram of one embodiment of a non-volatile memory system.

FIG. 4 is a block diagram of one embodiment of a flash memory system that can be used to implement one or more embodiments of the present disclosure. Other systems and implementations can be used. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote or inhibit programming and erasing. Row control circuit 306 is connected to the word lines to select word lines, to apply read voltages, to apply program voltages combined with the bit line potential levels controlled by column control circuit 304, and to apply an erase voltage. C-source control circuit 310 controls a common source connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Column control circuitry 304 can include a plurality of sense blocks 320, each associated with one or more bit lines for performing sense operations. For example, a single sense block may be associated with eight bit lines and include one common portion and eight separate sense modules for the individual bit lines. For further details refer to U.S. patent application Ser. No. 11/026,536 "Non-Volatile Memory & Method with Shared Processing for an Aggregate of Sense Amplifiers" filed on Dec. 29, 2004 which is incorporated by reference herein in its entirety. The sense modules 320 determine whether a conduction current in a connected bit line or other parameter is above or below a predetermined threshold level. The sense module can determine the data stored in a sensed memory cell and store the determined data in a data latch stack 322. The data latch stack 322 is used to store data bits determined during read operations. It is also used to store data bits programmed into memory during a program operation. In one embodiment, the data latch stack 322 for each sense module 320 includes three data latches. A sense module can also include a bit line latch that is used to set a voltage condition on the connected bit line. For example, a predetermined state latched in the bit line latch can result in the connected bit line being pulled to a state designating program inhibit (e.g., Vdd).

Command data for controlling the flash memory device is input to controller 318. The command data informs the flash memory of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314 which are part of control circuitry 315. Command circuits 314 are in communication with state machine 316. Controller 318 typically contains buffer memory for the user data being written to or read from the memory array.

One exemplary memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host).

Thus, the controller can be embedded in the host or included within the removable memory system.

Figure 5:
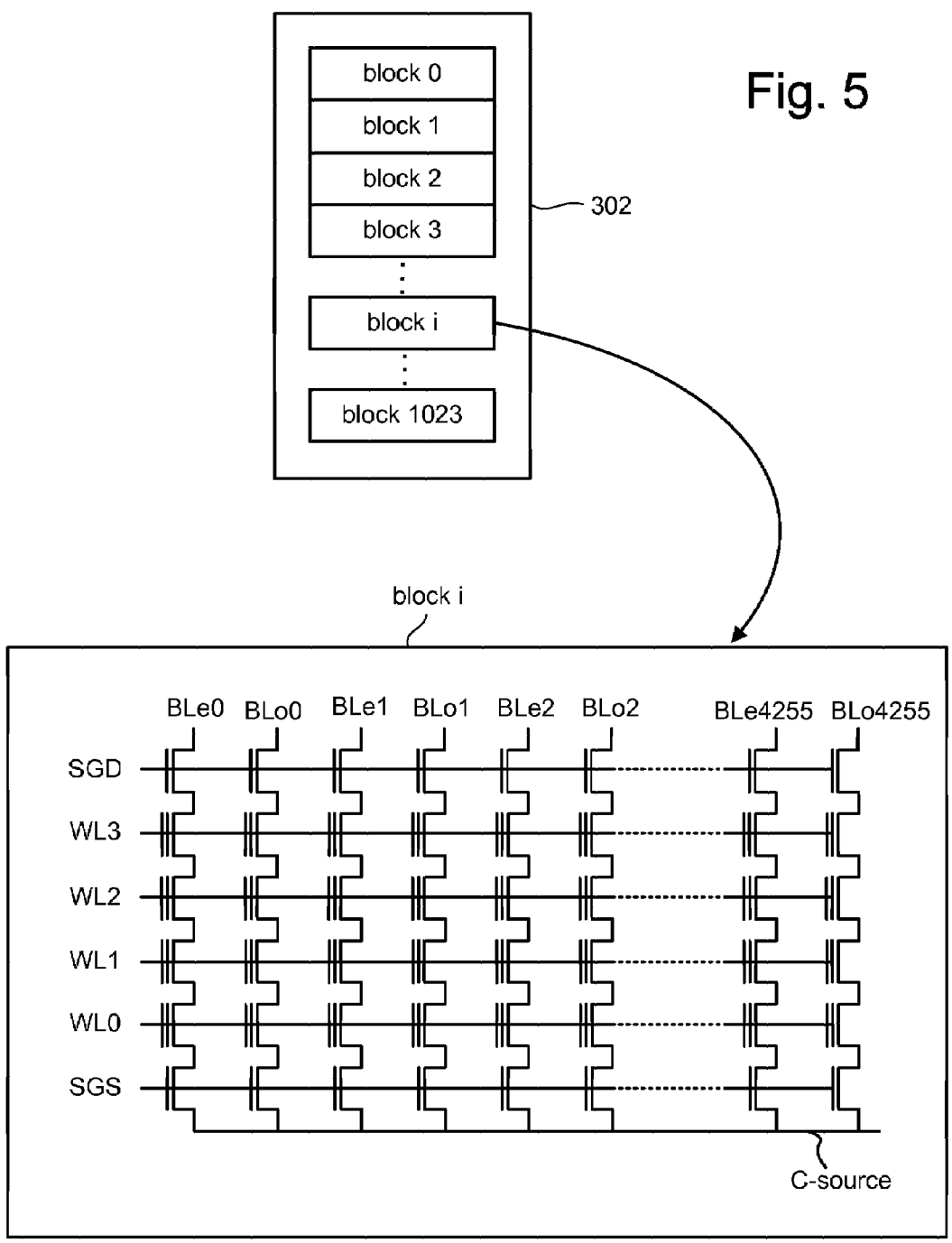
FIG. 5 illustrates an exemplary organization of a memory array.

With reference to FIG. 5, an exemplary structure of memory cell array 302 is described. As one example, a NAND flash EEPROM is described that is partitioned into 1,024 blocks. The data stored in each block can be simultaneously erased. In one embodiment, the block is the minimum unit of cells that are simultaneously erased. Memory cells are erased by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative (in one embodiment).

In each block in the example of FIG. 5 there are 8,512 columns. Each block is typically divided into a number of pages which can be a unit of programming. Other units of data for programming are also possible and contemplated. In one embodiment, individual pages may be divided into segments and the segments may contain the fewest number of cells that are written at one time as a basic programming operation. One or more pages of data are typically stored in one row of memory cells.

In each block of the example in FIG. 5 there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. FIG. 5 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor or gate (connected to select gate drain line SGD), and another terminal is connected to c-source via a second select transistor (connected to select gate source line SGS).

During read and programming operations of one embodiment, 4,256 memory cells are simultaneously selected. The memory cells selected have the same word line (e.g. WL2), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-state cell), a block such as this can store 16 pages (or each of the 8 pages include 1064 bytes, for example). Other sized blocks and pages can also be used with embodiments. In one embodiment, a set of memory cells that are simultaneously selected can store more than one page of data.

Architectures other than that of FIGS. 4 and 5 can be used in accordance with embodiments. In one embodiment, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. For more information regarding different bit line architectures and associated operational techniques, see U.S. patent application Ser. No. 11/099,133, entitled "Compensating for coupling during Read Operations of Non-Volatile Memory," filed Apr. 5, 2005, incorporated by reference herein in its entirety.

In read and verify operations, the select gates of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a one bit memory cell, the selected word line WL2 is grounded, so that it is detected whether the threshold voltage is higher than 0V. In a verify operation of a one bit memory cell, the selected word line WL2 is connected to 0.8V, for example, so that as programming progresses it is verified whether or not the threshold voltage has reached 0.8V. The source and p-well are at 0V during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. Other current and voltage sensing techniques can be used in accordance with embodiments. During read or sensing for multi-state cells, state machine 316 steps through various predefined control gate reference voltages corresponding to the various memory states. The sense module will trip at one of the voltages and an output will be provided from the sense module. A processor in the sense module can determine the resultant memory state by consideration of the tripping event(s) and information about the applied control gate voltage from the state machine. A binary encoding for the memory state is computed and stored in the data latches.

During program and verify operations, data to be programmed to a set of cells can be stored in the set of data latches 322 for each bit line. The drain and p-well of the memory receive 0V while the control gates of the addressed memory cells receive a series of programming pulses with increasing magnitudes. In one embodiment, the magnitudes of the pulses in the series range from 12V to 24V. In other embodiments, the range can be different, for example, having a starting level higher than 12V. During programming, verify operations are carried out between programming pulses. The programmed level of each cell being programmed in parallel is read between each programming pulse to determine whether or not it has reached or exceeded a verify level for the state to which it is being programmed. The verify level can be a target minimum threshold voltage for cells in the corresponding memory state. One means of verifying programming tests conduction at specific compare points. Cells verified to be sufficiently programmed are locked out to inhibit further programming. The voltage of a verified cells bit line is raised from 0V to Vdd (e.g., 2.5 volts) for subsequent programming pulses to terminate the programming process for those cells. In some cases, the number of pulses is limited (e.g. 20 pulses) and if a given memory cell is not sufficiently programmed by the last pulse, an error is assumed.

Figure 6:
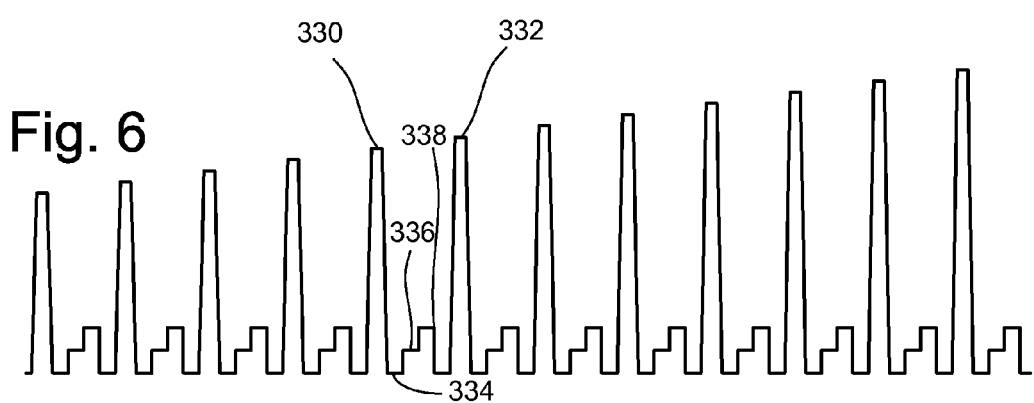
FIG. 6 depicts a program voltage signal in accordance with one embodiment.

FIG. 6 depicts a program voltage signal in accordance with one embodiment. This signal has a set of pulses with increasing magnitudes. The magnitude of the pulses is increased with each pulse by a predetermined step size. In one embodiment that includes the memory cells storing multiple bits of data, an exemplary step size is 0.2 volts (or 0.4 volts). Between each of the program pulses are the verify pulses. The signal of FIG. 6 assumes a four state memory cell, therefore, it includes three verify pulses. For example, between programming pulses 330 and 332 are three sequential verify pulses. The first verify pulse 334 is depicted at a 0V verify voltage level. The second verify pulse 336 follows the first verify pulse at the second verify voltage level. The third verify pulse 338 follows the second verify pulse 336 at the third verify voltage level. A multi-state memory cell capable of storing data in eight states may need to perform verify operations at seven compare points. Thus, seven verify pulses are applied in sequence to perform seven verify operations at seven verify levels between two consecutive programming pulses. Based on the seven verify operations, the system can determine the state of the memory cells. One means for reducing the time burden of verifying is to use a more efficient verify process, for example, as disclosed in: U.S. patent application Ser. No. 10/314,055, entitled "Smart Verify for Multi-State Memories," filed Dec. 5, 2002; U.S. patent application Ser. No. 11/259,799, entitled "Method for Programming of Multi-State Non-Volatile Memory Using Smart Verify", filed Oct. 27, 2005; and U.S. patent application Ser. No. 11/260,658, entitled "Apparatus for Programming of Multi-State Non-Volatile Memory Using Smart Verify," filed Oct. 27, 2005, all of which are incorporated herein by reference in their entirety.

The erase, read and verify operations described above are performed according to techniques known in the art. Thus, many of the details explained can be varied by one skilled in the art.

Figure 7:
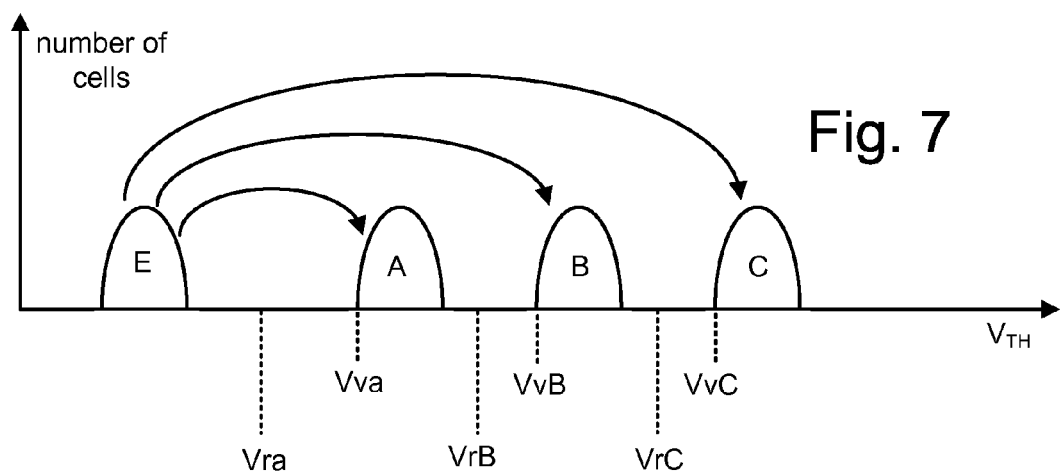
FIG. 7 depicts an exemplary set of threshold voltage distributions and a full sequence programming process.

At the end of a successful program process, the threshold voltages of the memory cells should be within one or more distributions of threshold voltages for programmed memory cells or within a distribution of threshold voltages for erased memory cells, as appropriate. FIG. 7 illustrates threshold voltage distributions for a group of memory cells when each memory cell stores two bits of data. FIG. 7 shows a first threshold voltage distribution E for erased memory cells and three threshold voltage distributions, A, B and C for programmed memory cells. In one embodiment, the threshold voltages in the E distribution are negative and the threshold voltages in the A, B and C distributions are positive.

Each distinct threshold voltage range of FIG. 7 corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a gray code assignment so that if the threshold voltage of a floating gate erroneously shifts to its neighboring physical state, only one bit will be affected. However, in other embodiments, gray coding is not used. One example assigns "11" to threshold voltage range E (state E), "10" to threshold voltage range A (state A), "00" to threshold voltage range B (state B) and "01" to threshold voltage range C (state C). Although FIG. 7 shows four states, embodiments in accordance with the present disclosure can also be used with other multi-state structures including those that include more or less than four states.

FIG. 7 shows three read reference voltages, Vra, Vrb and Vrc, for reading data from memory cells. By testing whether the threshold voltage of a given memory cell is above or below Vra, Vrb and Vrc, the system can determine what state the memory cell is in. If a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. FIG. 7 also shows three verify reference voltages, Vva, Vvb and Vvc spaced equally from one another. When programming memory cells to state A, the system tests whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc. The verify voltages define the range of threshold voltages assigned to a particular physical state and the forbidden ranges therebetween. The verify levels are spaced to provide sufficient margin between the highest threshold voltage in one state and the lowest threshold voltage in the next state. A naturally occurring larger margin exists between erased state E and first programmed state A.

FIG. 7 further depicts full sequence programming. In full sequence programming, memory cells are programmed from the erased state E directly to any of the programmed states A, B or C. A population of memory cells to be programmed may first be erased so that all the memory cells are in erased state E. A series of program voltage pulses is then applied to the control gates of the selected memory cells to program the memory cells directly into states A, B or C. While some memory cells are being programmed from state E to state A, other memory cells are being programmed from state E to state B and/or from state E to state C.

Figure 8:
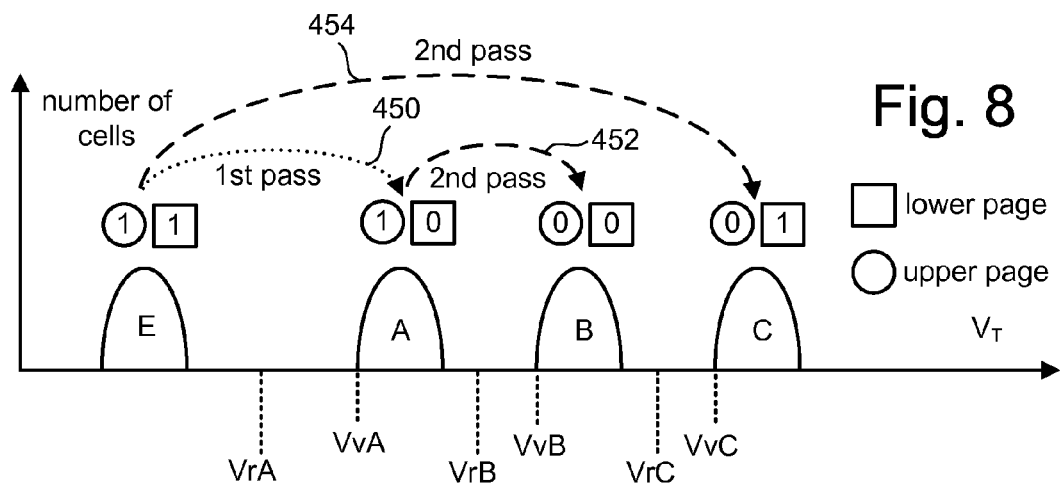
FIG. 8 depicts an exemplary set of threshold voltage distributions and a two-pass programming process.

FIG. 8 illustrates an example of a two-pass technique of programming multi-state memory cells that store data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 450. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 454. If the cell had been programmed into state A as a result of the first programming pass, then the memory cell is further programmed in the second pass so that the threshold voltage is increased to be within state B, as depicted by arrow 452.

The result of the second pass is to program the cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page with the data received. When subsequent data is received, the system will then program the upper page. In yet another embodiment, the system can start writing data using the two-pass technique and then convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Floating gate coupling can cause unrecoverable errors during read operations which may necessitate the performance of error recovery during reading. The charge stored on the floating gate of a memory cell can undergo an apparent shift because of electrical field coupling from charge stored at a neighboring memory cell's floating gate or other charge storage region (e.g., dielectric charge storage region). While in theory the electric field from a charge on the floating gate of any memory cell in a memory array can couple to the floating gate of any other memory cell in the array, the effect is most pronounced and noticeable with adjacent memory cells. Adjacent memory cells may include neighboring memory cells that are on the same bit line, neighboring memory cells on the same word line, or neighboring memory cells that are on both a neighboring bit line and neighboring word line, and thus, adjacent from each other in a diagonal direction. The apparent shift in charge can result in errors when reading the memory state of a memory cell.

The effects of floating gate coupling are most pronounced in situations where a memory cell adjacent a target memory cell is programmed subsequent to the target memory cell, however its effects may be seen in other situations as well. A charge placed on the floating gage of an adjacent memory cell, or a portion of the charge, will effectively be coupled to the target memory cell through electrical field coupling, resulting in an apparent shift of the threshold voltage of the target memory cell. A memory cell's apparent threshold voltage can be shifted to such a degree after being programmed that it will not turn on and off (conduct) under the applied reference read reference voltages as expected for a memory cell in the memory state to which it was intended to be programmed.

Typically, rows of memory cells are programmed starting with the word line (WL0) adjacent to the source side select gate line. Programming proceeds sequentially thereafter by word line (WL1, WL2, WL3, etc.) through the strings of cells such that at least one page of data is programmed in an adjacent word line (WLn+1) after completing programming (placing each cell of the word line into its final state) of the preceding word line (WLn). This pattern of programming results in an apparent shift of the threshold voltage of memory cells after they have been programmed due to floating gate coupling. For every word line except the last word line of a string to be programmed, an adjacent word line is programmed subsequent to completing programming of the word line of interest. The negative charge added to the floating gates of memory cells on the adjacent, later programmed word line raises the apparent threshold voltage of the memory cells on the word line of interest.

FIGS. 9A-10B depict the effects of floating gate coupling for a set of memory cells programmed using full sequence programming as depicted in FIG. 7. FIG. 9B depicts the threshold voltage distributions for a set of memory cells of selected word line WLn after being programmed. Distribution 500 depicts the actual threshold voltage distribution of cells at WLn in erased (not programmed) state E, distribution 505 depicts the actual threshold voltage distribution of cells at WLn programmed to state A, distribution 510 depicts the actual threshold voltage distribution of cells at WLn programmed to state B, and distribution 520 depicts the actual threshold voltage distribution of cells at WLn programmed to state C. The set of memory cells could include each memory cell of a selected row or word line WLn or just the cells of WLn connected to a particular type of bit line (even or odd). FIG. 9A depicts the threshold voltage distribution for the memory cells of an adjacent word line WLn+1 before programming. The cells of WLn+1 are programmed after programming the cells of WLn. Because each cell at WLn+1 is erased and not yet programmed, they cause no adverse floating gate coupling effects on the cells of WLn. More importantly, they are in the same state as they were when programming WLn so that the cells of WLn have apparent threshold voltages equal to the level verified during programming.

FIG. 10A depicts the threshold voltage distribution for the set of memory cells of $WL_{n+1}$ after being programmed. The memory cells have been programmed from the erased threshold voltage distribution E to programmed threshold voltage distributions A, B, and C. The charge placed on the floating gates of the memory cells of word line $WL_{n+1}$ after programming word line $WL_n$ may alter the memory state of the memory cells of $WL_n$ as seen by the memory system during sensing. An electrical field associated with the charges on the floating gates of word line $WL_{n+1}$ will couple to the floating gates of the memory cells at word line $WL_n$. The electrical field will cause an apparent shift in the threshold voltage of the memory cells at $WL_n$.

FIG. 10B depicts the apparent threshold voltage distributions for the memory cells at word line $WL_n$ after programming $WL_{n+1}$. Each programmed state is depicted with four different corresponding threshold voltage distributions. The overall distribution for each physical state can be broken down into four individual distributions based on the state to which adjacent memory cells at word line $WL_{n+1}$ were programmed. Each memory cell at word line $WL_n$ having an adjacent memory cell at $WL_{n+1}$ (on the same bit line) programmed to state A will experience a first level of shift in its apparent threshold voltage. Each cell at $WL_n$ having an adjacent cell at $WL_{n+1}$ in state B will experience a second, larger shift in apparent threshold voltage. Each cell having an adjacent cell at $WL_{n+1}$ in state C will experience a third, even larger shift.

For the cells at $WL_n$ in state A, distribution 502 depicts the threshold voltages for those cells having an adjacent memory cell on word line $WL_{n+1}$ that remained in erased state E after programming. Distribution 504 depicts the threshold voltages for cells having an adjacent cell at word line $WL_{n+1}$ that was programmed to state A. Distribution 506 depicts the threshold voltages for cells having an adjacent cell at word line $WL_{n+1}$ that was programmed to state B. Distribution 508 depicts the threshold voltages for the memory cells having an adjacent cell at word line $WL_{n+1}$ that was programmed to state C.

The memory cells at WL$_n$ programmed to the other states experience similar coupling effects. Accordingly, four individual threshold voltage distributions are also depicted for states B and C. The memory cells at word line WL$_n$ programmed to state B will appear to have four different threshold voltage distributions 512, 514, 516, and 518 based upon the subsequently programmed state of adjacent memory cells at word line WL$_{n+1}$. The memory cells of WL$_n$ programmed to state C will likewise have four different distributions 522, 524, 526, and 528. It should be noted that the coupling effects are also experienced by the erased memory cells of WL$_n$. The shifts are not depicted because the naturally occurring margin between erased state E and state A is generally sufficient that shifting does not cause errors in reading erased cells. However, the effects exist and the disclosed techniques can address those as well.

The increase in apparent threshold voltage of memory cells can induce read errors. As shown in FIG. 10B, some memory cells of WL$_n$ originally programmed to state A can have their threshold voltage shifted above the read reference voltage level Vrb. This can result in an error when reading. With the read reference voltage Vrb applied, these memory cells may not conduct even though they are programmed to state A. The state machine and controller may determine that the memory cells are in state B rather than state A (after sensing no conduction with Vrb applied). Some memory cells of WL$_n$ originally programmed to state B may also shift above the read reference voltage Vrc, potentially causing read errors in the same manner.

Figure 11:
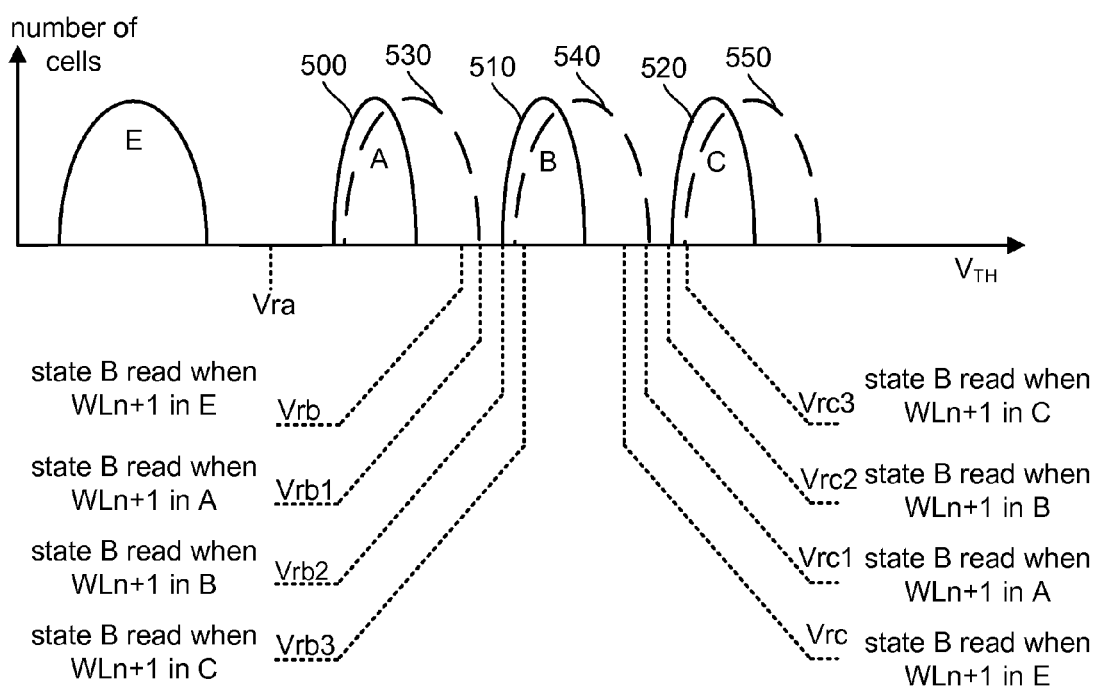
FIG. 11 depicts the threshold distributions of the memory cells of FIG. 10B with offset read reference voltages used to compensate for floating gate coupling.

FIG. 11 depicts a reading technique that can be used to address some of the apparent shifts in threshold voltages illustrated in FIG. 10B. In FIG. 11, the four distributions for each state of the cells at WL$_n$ depicted in FIG. 10B have been condensed to distributions 530, 540, and 550 representing the cumulative effects of coupling on the population of memory cells. Distribution 530 represents the cells of WL$_n$ in state A after programming WL$_n$, distribution 540 represents the cells of WL$_n$ in state B after programming WL$_n$, and distribution 550 represents the cells of WL$_n$ in state C after programming WL$_{n+1}$. Distribution 530 includes the individual distributions 502-508, distribution 540 includes the individual distributions 512-518 and distribution 550 includes the individual distributions 522-528.

When reading data on word line WL$_n$, the data of word line WL$_{n+1}$ can also be read, and if the data on word line WL$_{n+1}$ has disturbed the data on WL$_n$, the read process for WL$_{n+1}$ can compensate for that disturb. For example, when reading word line WL$_n$, state or charge level information for the memory cells at word line WL$_{n+1}$ can be determined in order to select appropriate read reference voltages for reading individual memory cells of word line WL$_n$. FIG. 11 depicts individual read reference voltages for reading WL$_n$ based on the state of an adjacent memory cell at word line WL$_{n+1}$. In general, different offsets (e.g., 0V, 0.1V, 0.2V, 0.3V) to the nominal read reference voltages are used and the results of sensing at different offsets selected as a function of the state of a memory cell on a neighboring word line. In one embodiment, the memory cells at word line WLn are sensed using each of the different read reference voltages. For a given memory cell, the results from sensing at an appropriate one of the read reference voltages can be selected based upon the state of an adjacent memory cell at word line WLn+1. In some embodiments, the read operation for WLn+1 determines the actual data stored at WLn+1, while in other embodiments, the read operation for WLn+1 only determines the charge levels of these cells, which may or may not accurately reflect the data stored at WLn+1. In some embodiments, the levels and/or the number of levels used to read WLn+1 may not be exactly the same as those used to read WLn. Some approximation of the floating gate threshold value can be sufficient for WLn correction purposes in some implementations. In one embodiment, the results of reading at WLn+1 can be stored in latches 322 at each bit line to be used when reading WLn.

A read operation can first be performed for the word line of interest WLn at the nominal read reference voltage levels Vra, Vrb, and Vrc which do not compensate for any coupling effects. The results of reading at the nominal reference levels are stored in the appropriate latches for bit lines with memory cells where the neighboring cell at WLn+1 was determined to be in state E. For other bit lines, the data is disregarded and the WLn+1 data maintained. A read operation is then performed for word line WLn using a first set of offsets to the read reference voltages. The read process can use Vra1 (Vra+0.1V), Vrb1 (Vrb+0.1V) and Vrc1 (Vrc+0.1V). The results from using these reference values are stored for bit lines with memory cells having neighboring memory cells at WL$_{n+1}$ in state A. A read operation is then performed with a second set of offsets using read reference levels Vra2 (Vra+0.2V), Vrb2 (Vrb+0.2V) and Vrc2 (Vrc+0.2V). The results are stored in latches for bit lines with memory cells having neighbors at WL$_{n+1}$ in state B. A read operation is performed for word line WL$_n$ with a third set of offsets using reference levels Vra3 (Vra+0.3V), Vrb3 (Vrb+0.3V) and Vrc3 (Vrc+0.3V) and the results stored for those bit lines having memory cells with neighboring cells at WL$_{n+1}$ in state C. In some embodiments, no offsets will be used at Vra because of the larger natural margin between state E and state A. Such an embodiment is depicted in FIG. 11 where a single read reference voltage Vra is depicted at the state A level. Other embodiments may use offsets for this level as well.

The different offsets to the nominal read reference voltages can be selected as a function of the state of a memory cell on the adjacent word line. For example a set of offset values could include a 0V offset corresponding to an adjacent cell in state E, a 0.1V offset corresponding to an adjacent cell in state A, a 0.2V offset corresponding to an adjacent cell in state B, and a 0.3V offset corresponding to an adjacent cell in state C. The offset values will vary according to implementation. In one embodiment, the offset values are equal to the amount of shift in apparent threshold voltage that results from an adjacent cell being programmed to a corresponding state. For example, 0.3V may represent the shift in apparent threshold voltage for a cell at WL$_n$ when an adjacent cell at WL$_{n+1}$ is subsequently programmed to state C. The offset values need not be the same for every reference voltage. For example, the offset values for the Vrb reference voltage may be 0V, 0.1V, 0.2V, and 0.3V while those for the Vrc reference voltage may be 0V, 0.15V, 0.25V and 0.35V. Additionally, the increment in offsets need not be the same for every state. For example, a set of offsets in one embodiment could include 0V, 0.1V, 0.3V, and 0.4V for adjacent cells in states E, A, B, and C, respectively.

In one embodiment, reading with a plurality of individual read reference levels for a given state and selecting the results based on the state of an adjacent memory cell can be expected to reduce the effects of floating gate charge coupling by about 50 percent. The threshold voltage distributions for a word line of memory cells as read by a sense module can be effectively narrowed by about 50 percent using these techniques.

Figure 12A:
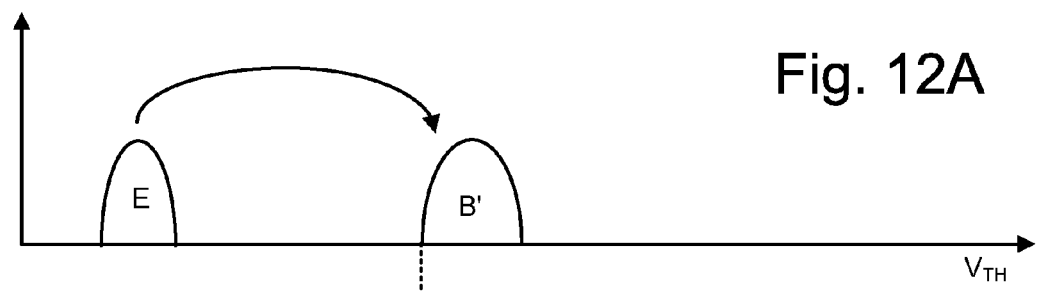
FIGS. 12A-12C depict exemplary threshold voltage distributions for a group of memory cells and a programming process that programs a select page of data for the group of memory cells after programming previous pages for adjacent groups of memory cells to reduce floating gate coupling effects.
Figure 12B:
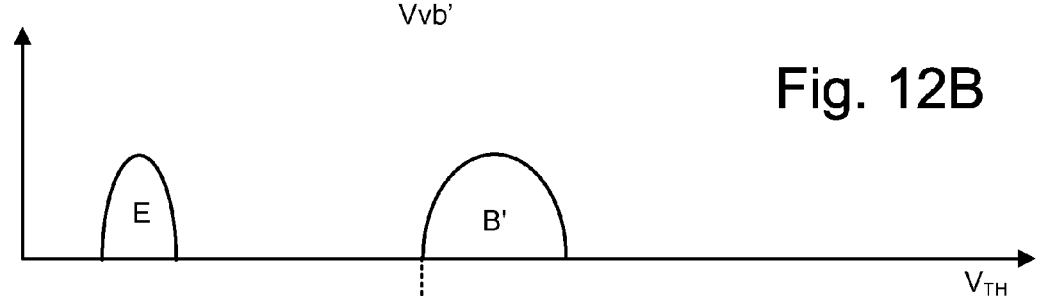
Figure 12C:
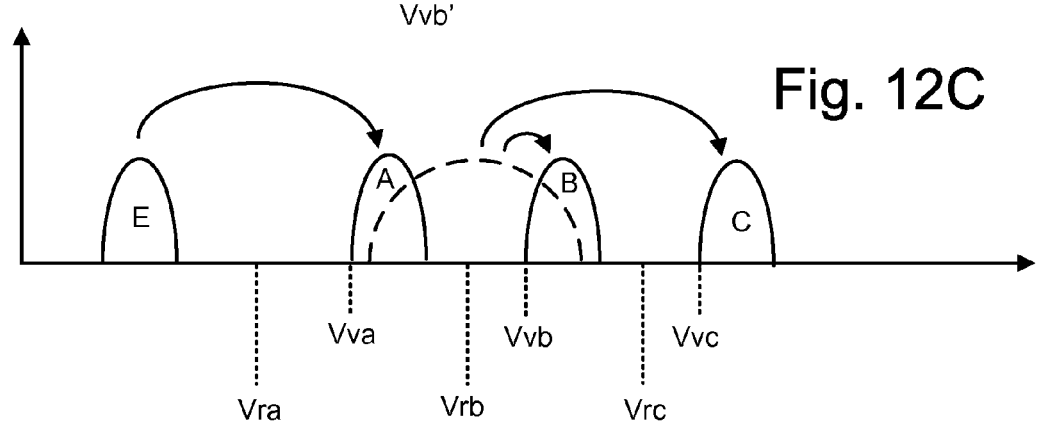

It is possible to structure programming processes for non-volatile memory to reduce the apparent shift in threshold voltage from floating gate coupling. FIGS. 12A-12C disclose a process for programming non-volatile memory that reduces floating gate to floating gate coupling by, for any particular memory cell, writing to that particular memory cell with respect to a particular page subsequent to writing to adjacent memory cells for previous pages. In the example of FIGS. 12A-12C, each cell stores two bits of data per memory cell, using four data states. Erased state E stores data 11, state A stores data 01, state B stores data 10, and state C stores data 00. Other encodings of data to physical data states can also be used. Each memory cell stores a portion of two logical pages of data. For reference purposes, these pages are called upper page and lower page but can be given other labels. State A is encoded to store bit 0 for the upper page and bit 1 for lower page, state B is encoded to store bit 1 for the upper page and bit 0 for the lower page, and state C is encoded to store bit 0 for both pages. The lower page data for memory cells at a word line WLn are programmed in a first step depicted in FIG. 12A and upper page data for the cells is programmed in a second step depicted in FIG. 12C. If the lower page data is to remain data 1 for a cell, then the cell's threshold voltage remains at state E during the first step. If the data is to be programmed to 0, then the threshold voltage of the memory cell is raised to state B'. State B' is an interim state B having a verify level Vvb', which is lower than Vvb.

Figure 3:
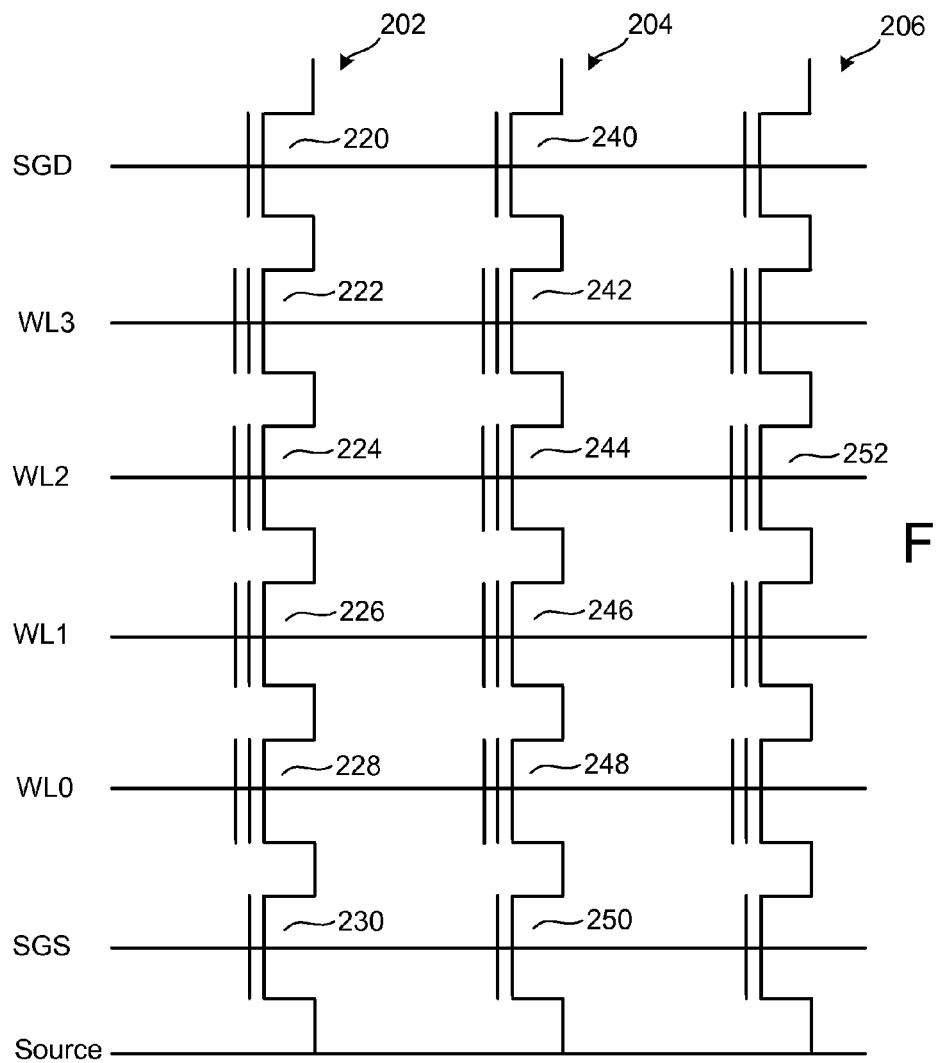
FIG. 3 is a circuit diagram depicting three NAND strings.

In one embodiment, after the lower page data for the memory cell is programmed, the neighboring memory cells at adjacent word line $WL_{n+1}$ will be programmed with respect to their lower page. For example, the lower page for memory cells at WL2 in FIG. 3 may be programmed after the lower page for memory cells at WL1. Floating gate coupling may raise the apparent threshold voltage of memory cell 226 if the threshold voltage of memory cell 224 is raised from state E to state B' after programming memory cell 226. The cumulative coupling effect on the memory cells at WLn will widen the apparent threshold voltage distribution of threshold voltages for the cells, as depicted as in FIG. 12B. The apparent widening of the threshold voltage distribution can be remedied when programming the upper page for the word line of interest.

FIG. 12C depicts the process of programming the upper page for the cell at WLn. If a memory cell is in erased state E and its upper page bit is to remain at 1, the memory cell remains in state E. If the memory cell is in state E and its upper page data bit is to be programmed to 0, the threshold voltage of the memory cell is raised to be within the range for state A. If the memory cell was in intermediate threshold voltage distribution B' and its upper page data is to remain 1, the memory cell is programmed to final state B. If the memory cell is in intermediate threshold voltage distribution B' and its upper page data is to become data 0, the threshold voltage of the memory cell is raised to be within the range for state C. The process depicted by FIGS. 12A-12C reduces the effect of floating gate coupling because only the upper page programming of neighbor memory cells will effect the apparent threshold voltage of a given memory cell. An example of an alternate state coding for this technique is to move from intermediate state B' to state C when the upper page data is a 1, and to move to state B when the upper page data is '0.' Although FIGS. 12A-12C provide an example with respect to four data states and two pages of data, the concepts taught by FIGS. 12A-12C can be applied to other implementations with more or less than four states and different numbers of pages.

FIG. 13A depicts the effects of floating gate coupling for the programming technique of FIGS. 12A-12C and FIG. 13B depicts a read method using compensation offsets to overcome some of these effects. The memory cells of word line WLn+1 adjacent world line WLn are programmed during a second pass to program their upper page data as shown in FIG. 12C. During this second pass, memory cells are programmed from either state E to state A, or from intermediate state B' to state B or state C. The memory cells of the word line of interest WLn are depicted in FIG. 13A and were programmed with respect to their upper page after the lower page for the memory cells at word line WLn+1 were programmed. Therefore, the upper page programming depicted in FIG. 12C is the only programming to affect the apparent threshold voltage for the memory cells at word line WLn.

The memory cells of word line WLn+1 programmed from state E to state A undergo a similar change in threshold voltage as the cells programmed from intermediate state B' to state C. Memory cells of adjacent word line WLn+1 that are programmed from intermediate state B' to state B do not undergo a significant increase in threshold voltage and cause little effect on the apparent threshold voltage of cells at WLn. The memory cells of WLn programmed to state A are represented by individual distributions 652, 654, 656, and 658 corresponding to cells having a neighboring cell at WLn+1 in state E, in state B, in state A, and in state C, respectively. The memory cells at WLn programmed to state B are represented by individual distributions 662, 664, 666, and 668 corresponding to the state B cells having a neighboring cell at WLn+1 in state E, in state B, in state A, and in state C, respectively. The memory cells of WLn programmed to state C are represented by individual distributions 672, 674, 676, and 678 corresponding to the state C cells having a neighboring cell at WLn+1 in state E, in state B, in state A, and in state C, respectively.

As shown in FIG. 13A, some memory cells of WLn may have their apparent threshold voltages shifted close to or beyond the read reference voltages Vrb or Vrc. This may cause read errors. As previously discussed, the described coupling effects are applicable to the WLn erased distribution, and the disclosed technology is equally applicable thereto. The effects on erased cells are not principally described because of the natural margin between state E and state C.

FIG. 13B depicts offsets for the read reference levels that can be used with the programming technique of FIGS. 12A-12C. For the sake of clarity, distributions 652, 654, 656, and 658 are depicted in a single combined distribution 651, distributions 662, 664, 666, and 668 are depicted in combined distribution 661, and distributions 672, 674, 676, and 678 are depicted in combined distribution 671. Distributions 650, 660, and 670 represent the cells of WLn before programming upper page data at WLn+1. In the embodiment of FIG. 13B, the similar effects of coupling from cells on an adjacent word line programmed to state A or state C are grouped together to form a single offset for each of these state levels. The results of sensing at offset reference voltages Vrb1 and Vrc1 are used for memory cells having an adjacent cell at word line WLn+1 in state A or state C. The minor coupling effects that result from programming from intermediate state B' to state B are ignored. The results of sensing when using nominal reference voltages Vrb and Vrc are used for memory cells having an adjacent cell at word line WLn+1 in state E or state B. Additional offsets for each particular state of WLn+1 can be used in one embodiment. While the technique depicted in FIG. 13B offers additional reductions to the effects of floating gate coupling, errors may still exist.

Misreads of an adjacent word line when attempting to determine an appropriate offset for reading a cell of interest can actually prove more problematic for cells programmed with the technique of FIGS. 12A-12C. Consider a misread of a memory cell at word line WLn+1 when applying the state B read reference voltage Vrb. If the memory cell at WLn+1 is programmed to state A and is misread as being in state B, the results of the read operation for the corresponding memory cell at word line WLn using the nominal read reference voltages will be selected and reported. No compensation for floating gate coupling is used since it is determined that the cell at WLn+1 is in state B and thus, only underwent a minor change in threshold voltage after programming WLn. In fact, however, the memory cell at WLn+1 will likely exhibit a strong influence on the apparent threshold voltage of the cell at WLn. It is likely that the cell at WLn+1 is at the upper end of the state A distribution, which is why it was misread. Thus, the memory cell at WLn+1 has undergone a large change in charge at its floating gate when being programmed from state E to the upper end of state A. The large change in charge stored by the cell at WLn+1 will cause a significant shift in the apparent threshold voltage of the cell at WLn. No compensation for this shift is used, however, because of the misread at WLn+1. Thus, it is possible, or even likely, that the memory cell at WLn will be misread as a result of the WLn+1 misread.

If an adjacent memory cell at word line WLn+1 programmed to state B is misread as in state A, similar problems can occur. A memory cell at word line WLn+1 that is read as being in state A, when in fact it is in state B, likely has a threshold voltage at the lower end of the state B distribution. The memory cell will have undergone very little change in threshold voltage after programming the memory cells at WLn+1. Consequently, very little or no shift in the apparent threshold voltage of the corresponding cell at WLn will occur. However, the results of the read operation at WLn for the corresponding memory cell will select results from reading at compensated reference levels. Because the memory cell of interest has not experienced a significant shift in apparent threshold voltage, selecting the results when the compensated reference levels are used may cause a misread or error at WLn.

In the prior art, programming memory cells to the various program states has been done with equally spaced verification levels as shown in FIGS. 13A-13B. That is to say, the verification level for state A, state B and state C are each equally spaced apart from one another, such that the difference in voltage between verification levels Vvb and Vva is equal to the difference in voltage between verification levels Vvc and Vvb. The equal spacing of programming verification levels results in the margins between the various programmed states being the same or substantially equal. The margin corresponds to the forbidden voltage range between physical states. The margin between state A and state B is defined by the maximum threshold voltage of a memory cell in state A and the minimum threshold voltage of a memory cell in state B. Sufficient margins between programmed states are provided so that accurate reading can be performed. Because of floating gate coupling, the margins between physical states can decrease and result in read errors.

In accordance with one embodiment of the present disclosure, a shifted verification level is used when programming one or more selected states, such as state B, to create a larger margin between certain states for improved sensing accuracy. In one embodiment, offset compensated read reference levels are not used at the level corresponding to the wider margin, but are used at other levels in order to provide a more efficient read for higher performance. The combination of selective application of offset reference levels with a wider margin between select physical states provides an accurate sensing technique while maintaining desired levels of performance. FIG. 14 depicts the threshold voltage distributions for a set of memory cells programmed in accordance with one embodiment of the present disclosure. Distributions 678, 680, 684, and 688 depict the set of memory cells after being programmed but before programming the cells at adjacent word line WLn+1.

A shifted program verification level Vvb1 is used in FIG. 14 when programming memory cells to state B. The embodiment of FIG. 14 may be used when programming according to the technique shown in FIGS. 12A-12C. Verify level Vvb1 is higher than that of Vvb in the traditional operation shown in FIG. 12C so that a larger margin is created between state A and state B. The highest threshold voltage of any memory cell in state A remains the same as in the traditional technique. The lowest threshold voltage of any cell in state B, however, is shifted in the positive direction. The increased verification level when programming memory cells to state B increases the margin between state A and state B. As shown in FIG. 14, the margin 683 between states A and B is larger than the margin 685 between states B and C. Consequently, misreads are less likely to occur when sensing at the state B reference voltage level Vrb.

Distributions 682, 686, and 690 illustrate the effects of floating gate coupling after a neighboring word line $WL_{n+1}$ is programmed (e.g., as illustrated in FIG. 12C). In FIG. 14, the Vrb read level is well spaced between the apparent A state distribution 682 and apparent B state distribution 686. Consequently, misreads are less likely to occur since even after the coupling effects from neighboring word lines are considered, the Vrb read level does not overlap the threshold voltage of any cell intended to be in state A. In one embodiment, the reference level Vrb is shifted from the traditional level used (e.g., Vrb in FIG. 12C) by an amount corresponding to the shift in program verify level Vvb1 from its nominal value Vvb shown in FIG. 12C. Because Vrb can be shifted well beyond the highest threshold voltage of any memory cell in state A, the single reference value Vrb can be used during reading and no compensations applied.

Accordingly, offsets for the read reference voltages are not used when reading at the state B level in one embodiment. In the embodiment of FIG. 14, offsets to the read reference voltage are only used for the highest state, state C. The larger margin between state A and state B that exists by virtue of the higher verification level permits accurate reading at the state B level without directly compensating for floating gate coupling. This technique not only reduces misreads, it also improves read times because additional reads at offset levels are only used at select states. In FIG. 14, only one additional sense operation is performed. In addition to improving performance and read times the reduced number of sense operations decreases the complexity and size of cache circuitry needed to maintain data regarding adjacent memory cells when sensing a selected memory cell.

By way of non-limiting example, the following read reference and program verification levels can be used in one embodiment when implementing the technique of FIG. 14. In the prior art techniques as described in FIGS. 12A-12C the margin between state A and state B in one exemplary system may be expected to be on the order of 0.7V, and about the same as the margin between state B and state C.

Such a prior art system may utilize verification and read levels of Vva=0.5V, Vvb=2.0V, Vvc=3.5V, Vra=0.0V, Vrb=1.5V, and Vrc=3.0V when programming and reading data to/from the cells. In FIG. 14, however, a shifted verify level for state B would result in such a system having a margin between state A and state B on the order of 0.7V, and a margin between state B and state C on the order of 0.1V. Typical read reference and program verification levels that can be used in FIG. 14 to achieve these margins can include Vva=0.5V, Vvb=2.3V, Vvc=3.5V, Vra=0.0V, Vrb=1.8V, Vrc=3.0V, and Vrc1=3.6V. In one embodiment as is illustrated, the difference in the read reference and program verification level at each state remains the same when Vvb is shifted since Vrb is shifted by the same amount. Therefore, Vva−Vra=Vvb−Vrb=Vvc−Vrc.

Figure 15:
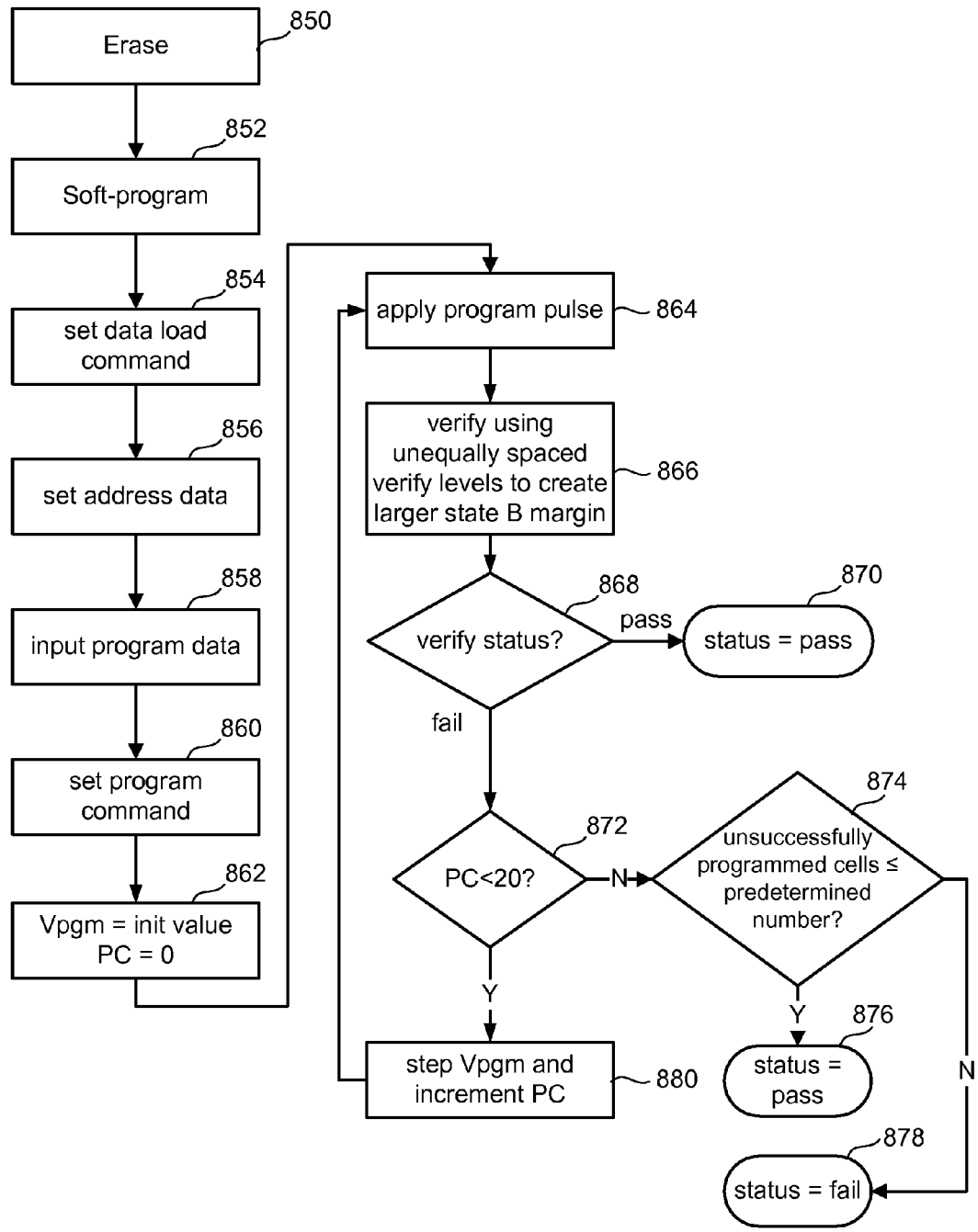
FIG. 15 is a flowchart describing one embodiment of a process for programming non-volatile memory to create a larger margin between select memory states.

FIG. 15 is a flowchart describing one embodiment of a method for programming non-volatile memory to achieve unequally sized margins as depicted in FIG. 14. The programming method depicted in FIG. 15 can be used to program a group of memory cells in parallel, such as those connected to a single word line. FIG. 15 can also be used to program select memory cells of a word line such as in an odd/even bit line architecture. In one embodiment, a first set of iterations from step 860 through step 882 is used to program a first logical page for a group of memory cells and a second iteration through steps 860-882 can be used to program a second logical page for the group of memory cells.

The memory cells to be programmed are erased at step 850. Step 850 can include erasing more memory cells than those to be programmed (e.g., in blocks or other units). At step 852 soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erased verify level. This will provide a narrower distribution for the erased memory cells. At step 854 a data load command is issued by controller 318 and input to command circuits 314, allowing data to be input to data input/output buffer 312. The input data is recognized as a command and latched by state machine 316 via a command latch signal, not illustrated, input to command circuits 314. At step 856, address data designating the page address is input to row controller 306 from the host. The input data is recognized as a page address and latched via state machine 316, effected by the address latch signal input to command circuits 314. At step 858, the page of program data for the addressed page is input to data input/output buffer 312 for programming. For example 532 bytes of data could be input in one exemplary embodiment. The input data is latched in the appropriate registers for the selected bit lines. In some embodiments the data is also latched in a second register for the selected bit lines to be used for the verify operations. At step 860 a program command is issued by the controller and input to data input/output buffer 312. The command is latched by state machine 316 via the command latch signal input to command circuits 314.

Triggered by the program command, the data latched in step 858 is programmed into the selected memory cells controlled by state machine 316. Using stepped program voltage pulses such as those depicted in the program voltage signal of FIG. 6, the program voltage signal is applied to the appropriate word line corresponding to the page or other unit of cells being programmed. At step 862, Vpgm, the programming pulse voltage level is initialized to the starting pulse (e.g., 12V) and a program counter PC maintained by state machine 316 is initialized at zero. At step 864 the first Vpgm pulse is applied to the selected word line. If logic zero is stored in a particular data latch indicating that the corresponding memory cell should be programmed, then the corresponding bit line is grounded. On the other hand, if logic 1 is stored in the particular latch indicating that the corresponding memory cell should remain in its current data state, the corresponding bit line is connected to $V_{DD}$ to inhibit programming.

At step 866, the states of the selected memory cells are verified. Heretofore, the process depicted in FIG. 15 has proceeded according to well known techniques. At step 866, however, the process includes a novel technique to create unequally spaced margins that facilitate more accurate reads of select levels. A larger margin is created between two programmed states. In one embodiment, the larger margin is created between lower level states while the highest state remains in its nominal position. In one embodiment, verifying is performed so that a larger margin exists between state B and state A. In other embodiments, the highest level state or higher level states may also be shifted in the positive direction by using larger verify voltages at those levels. However, shifting the distributions to an overall higher positive voltage can be unacceptable in some implementations where the voltage levels (e.g., Vpgm) are to be kept to a certain maximum level for such reasons as minimizing program disturb, etc.

Unequally spaced verify levels are used at step 866 in one embodiment to create unequal margins. As depicted in FIG. 14, the verify level Vvb1 for the second programmed state B is spaced from the verify level for the first programmed state, state A, by a different amount than that by which the verify level for the third programmed state, state C, is separated from the verify level for the second program state, state B. The verify levels Vva, Vvb and Vvc define the lowest minimum threshold voltage for their particular states. By using unequally spaced verify levels the margin created between state A and state B is larger than that created between state B and state C.

After sensing with the reference voltages applied, it is checked whether all of the data latches are storing logic 1 at step 868. If so, the program process is complete and successful because all selected memory cells were programmed and verified to their target states. A status of pass is reported at step 876. If it is determined at step 868 that not all of the data latches are storing logic 1, the process continues at step 872 where the program counter PC is checked against a program limit value. One example of a program limit value is 20 although other values can be used in various embodiments. If the program counter PC is not less than 20 then it is determined at step 874 whether the number of unsuccessfully programmed memory cells is less than or equal to a predetermined number. If the number of unsuccessfully programmed cells is equal to or less than this number then the process is flagged as passed and a status of pass is reported at step 876. The bits that are not successfully programmed can be corrected using error correction during the read process. If the number of unsuccessfully programmed memory cells is greater than the predetermined number, the program process is flagged as failed and a status of fail is reported at step 878. If the program counter PC is less than 20 then the $V_{pgm}$ level is increased by the step size and the program counter PC is incremented at step 880. After step 880, the process loops back to step 864 to apply the next $V_{pgm}$ pulse.

Figure 16:
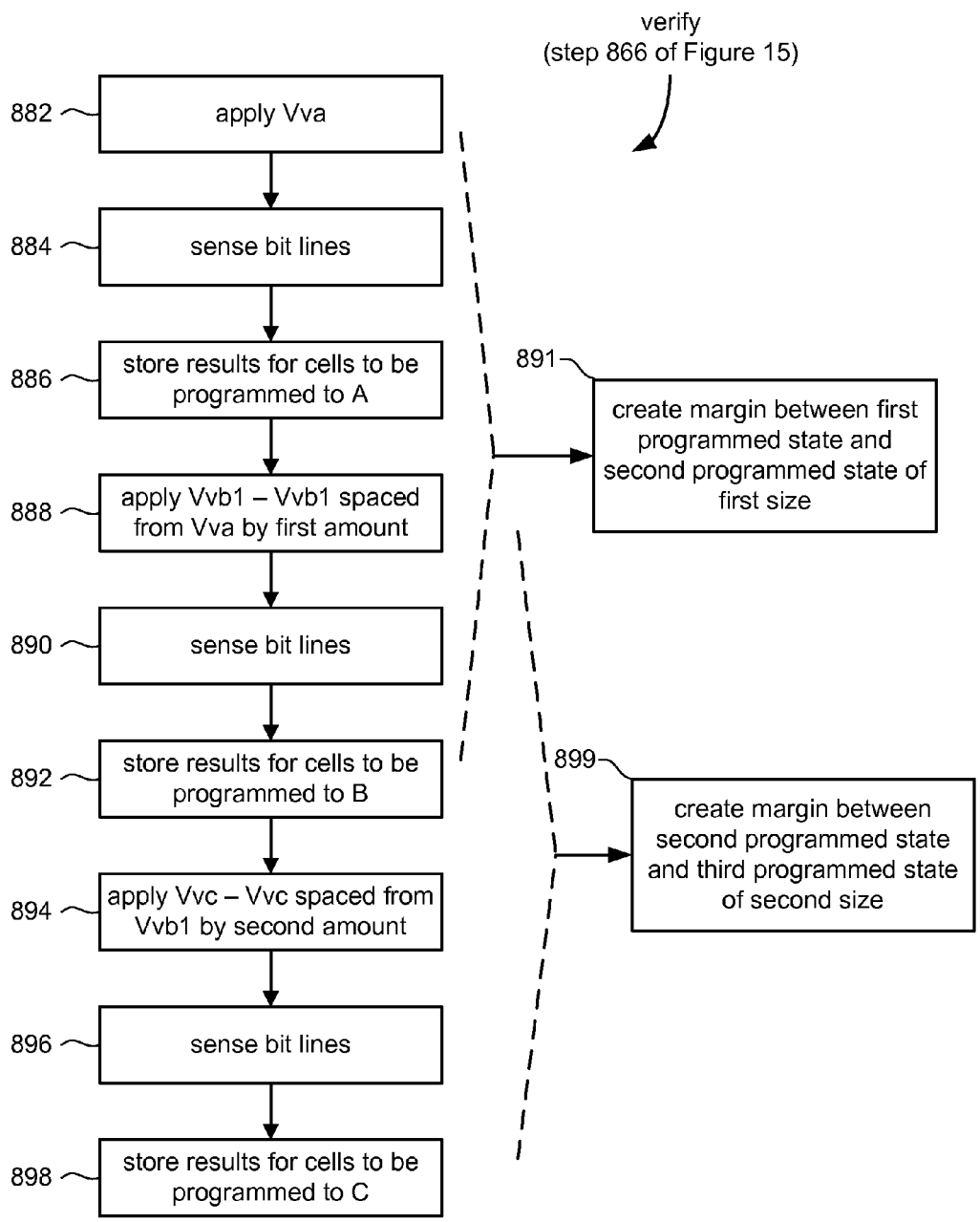
FIG. 16 is a flowchart describing one embodiment of a process for verifying programming of non-volatile memory to create a larger margin between select memory states.

As described, step 866 includes the use of unequally spaced verify levels so that unequally spaced margins exist for programmed memory cells. FIG. 16 depicts one embodiment of step 866 of FIG. 15. At step 882, the first programmed state verify level Vva is applied. At step 884, the bit lines are sensed with Vva applied to the memory cell at each bit line. At step 886, the results are stored for cells that are to be programmed to state A. Step 886 can include setting the data latch for a bit line to a logic 1 to indicate that programming is to continue for that memory cell or to logic 0 indicating that the memory cell is at or above its target level and programming for that memory cell should be stopped. At step 888, the second programmed state verify level Vvb1 is applied to each memory cell being verified. Verify level Vvb1 is spaced from verify level Vva by a first amount. For example, Vva and Vvb1 can be separated from one another by an amount equal to about 0.8V. At step 890, the bit lines are sensed with Vvb1 applied to each memory cell. The results are stored at 892 by indicating in the data latch for each bit line whether the corresponding memory cell has reached its target level. At step 894, the third verify level Vvc is applied for the third programmed state. Verify level Vvc is spaced from verify level Vvb1 by a second amount which is different from the first amount separating Vva and Vvb1. As depicted in FIG. 14, the spacing between verify levels Vvb1 and Vvc is less than that between verify levels Vva and Vvb1. At step 896, the bit lines are sensed with Vvc applied to each memory cell. At step 898, the results are stored for the cells to be programmed to state C, for example, by indicating in a data latch whether the cells should undergo further programming.

As shown in boxes 891 and 899, the unequally spaced verify levels result in a margin of a first size between states A and B and a margin of a second size between states B and C. The margin between states A and B is larger than that between states B and C because of the shifted Vvb verify level.

Figure 17:
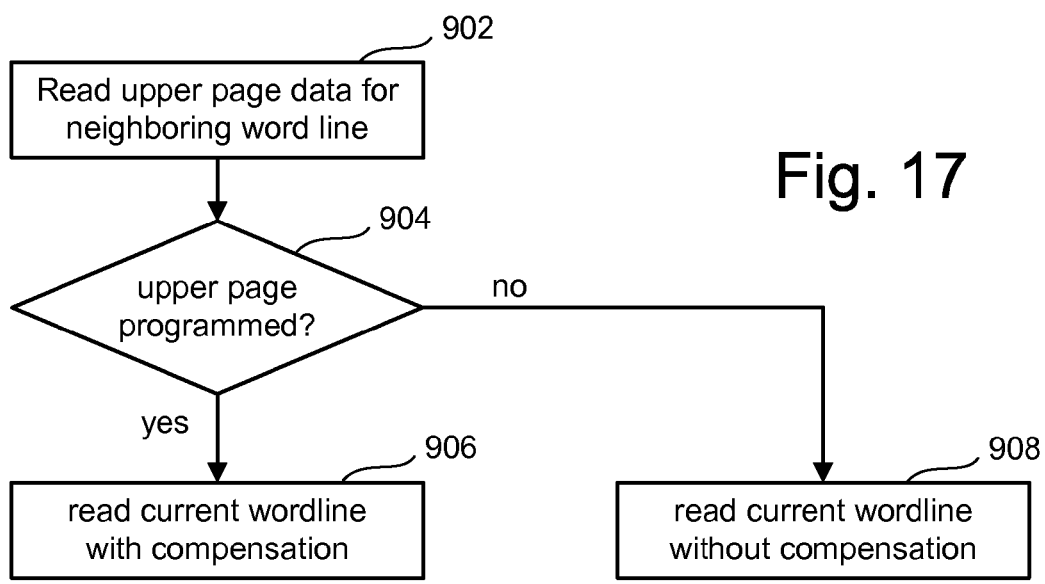
FIG. 17 is a flowchart describing one embodiment of a process for reading non-volatile memory.

FIG. 17 is a flowchart depicting an overall process for reading data performed in response to a request to read a particular one or more pages or other groupings of data. In other embodiments, the process of FIG. 17 can be performed as part of a data recovery operation after detecting errors in response to a tradition read process. When reading data programmed according to the process FIGS. 12A-12C, any perturbation from floating gate coupling due to programming the lower page of neighboring cells is corrected when programming the upper page of the cell of interest. Therefore, when attempting to compensate for the floating gate coupling effects from neighboring cells, the process need only consider the coupling effects due to programming the upper page of neighboring cells.

At step 902 of FIG. 17, the upper page data for the subsequently programmed word line neighboring the word line of interest is read. If the upper page of the neighboring word line is not programmed as determined at step 904, the word line or page of interest is read without compensating for floating gate coupling effects at step 908. If the upper page of the neighboring word line is programmed, the page of interest is read at step 906 using compensation for floating gate coupling effects. In some embodiments, reading the cells of the neighboring word line results in a determination of charge levels on the neighboring word line, which may or may not accurately reflect the data stored thereon.

In one embodiment, a memory array reserves a set of memory cells to store one or more flags. For example, a column of memory cells can be used to store flags indicating whether the lower page of the respective rows of memory cells has been programmed and another column to store flags indicating whether the upper page for the respective rows of memory cells has been programmed. By checking an appropriate flag, it can be determined whether the upper page for the neighboring word line has been programmed. More details about such a flag and the process for programming can be found in U.S. Pat. No. 6,657,891, Shibata et al., "Semiconductor Memory Device For Storing Multi-Valued Data," incorporated herein by reference in its entirety.

Figure 18:
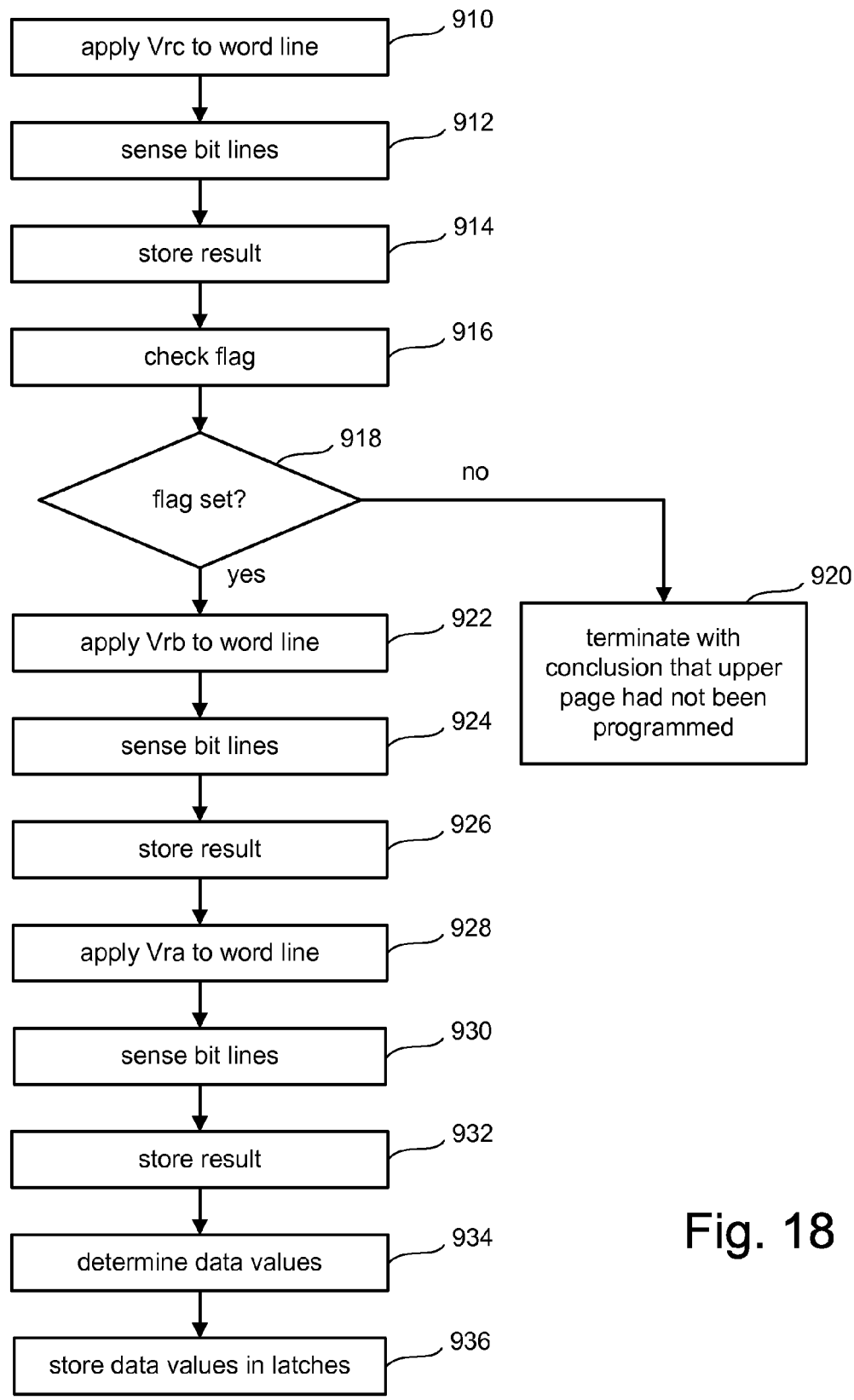
FIG. 18 is a flowchart describing one embodiment of a process for reading upper page data from non-volatile memory cells.

FIG. 18 describes one embodiment of a process for reading the upper page data for a neighboring word line that can be used at step 902 of FIG. 17. Read reference voltage Vrc is applied to the word line at step 910, and at step 912, the bit lines are sensed as described above. The results of sensing are stored in the appropriate latches at step 914. Reading first at Vrc is chosen to uniquely determine upper page data since lower page data will normally already have been written to $WL_{n+1}$ and reading at Vra or Vrb will not guarantee a unique result since intermediate distribution B' (FIG. 12B) may overlap these values.

At step 916, the flag indicating upper page programming associated with the page being read is checked. If the flag is not set as determined at step 918, the process terminates with the conclusion that the upper page is not programmed at step 920. If the flag is set, it is assumed that the upper page is programmed. Read reference voltage Vrb is applied to the word line associated with the page being read at step 922. At step 924, the bit lines are sensed and the results stored in the appropriate latches at step 926. At step 928, read reference voltage Vra is applied. At step 930, the bit lines are sensed and the results are stored in the appropriate latches at step 932. At step 934, the data value stored by each of the memory cells being read is determined based on the results of sensing steps 912, 924 and 930. The data values can be stored in the appropriate data latches at step 936 for eventual communication to the user. The upper page and lower page data are determined using well known logic techniques that depend on the specific state coding chosen. For the exemplary coding described in FIGS. 12A-12C the lower page data is Vrb* (the complement of the value stored when reading at Vrb), and the upper page data is Vra* OR (Vrb AND Vrc*). The process of FIG. 18, though here described as being used to read $WL_{n+1}$, can also be used to read $WL_n$ as described below.

Figure 19:
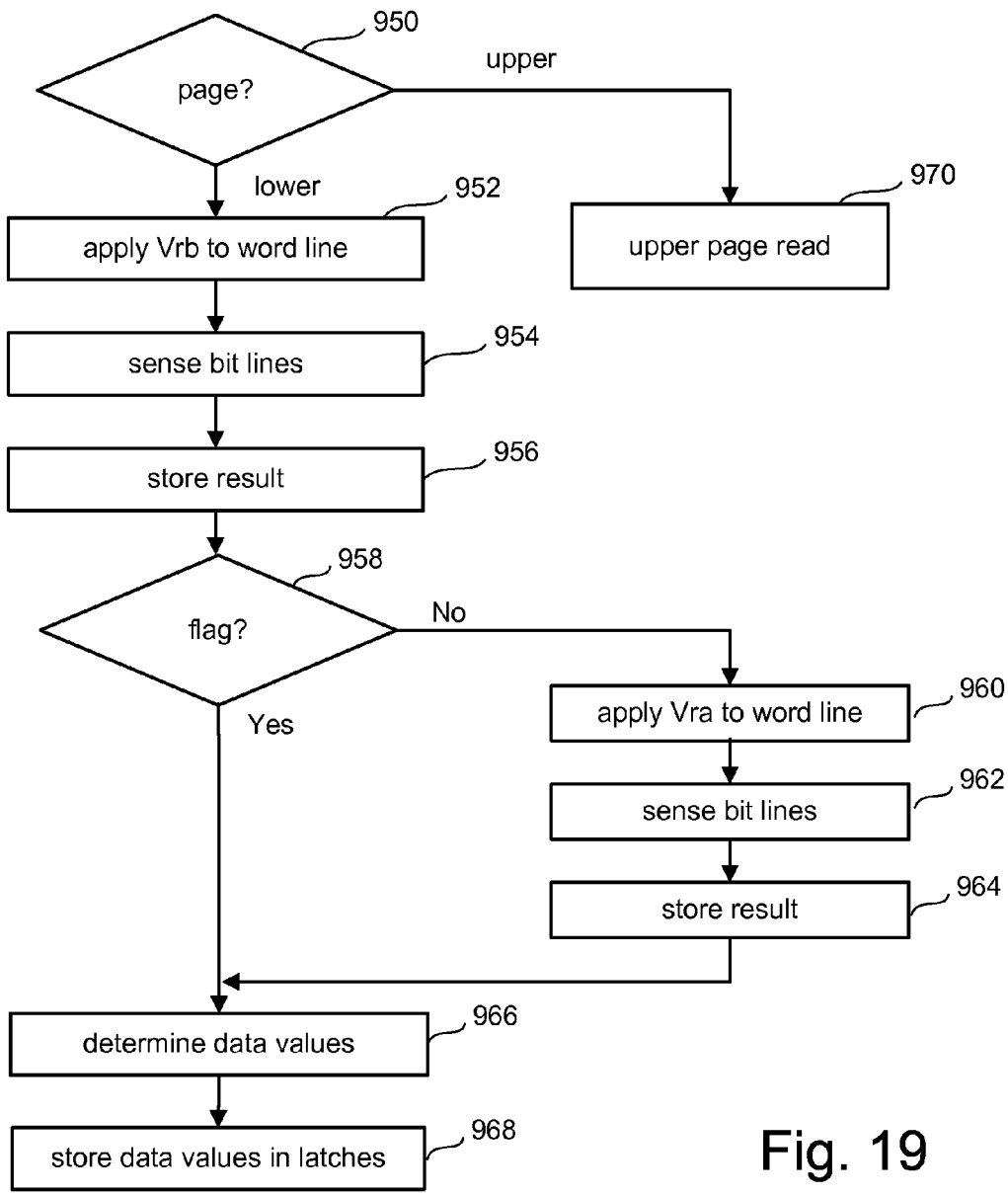
FIG. 19 is a flowchart describing one embodiment of a process for reading data without using compensation.

FIG. 19 is a flowchart describing an embodiment for reading data of a word line of interest when compensating for floating gate coupling from a neighboring word line is not needed (step 908 of FIG. 17). At step 950, it is determined whether the upper page or lower page associated with the word line of interest is being read. If the lower page is being read, read reference voltage Vrb is applied to the appropriate word line at step 952. At step 954, the bit lines are sensed, and at step 956 the results stored in the appropriate latches. At step 958, a flag is checked to determine if the page of interest contains upper page data. If there is no flag set, any programmed data will be in the intermediate state B'. Thus, Vrb does not produce any accurate sensing result so the process continues at step 960 where Vra is applied to the word line. The bit lines are re-sensed at step 962, and at step 964, the results are stored. At step 966 a data value to be stored is determined. In one embodiment, if the memory cell turns on with Vrb (or Vra) applied to the word line, then the lower page data is "1." Otherwise, the lower page data is "0."

If it is determined that the page address corresponds to the upper page at step 950, an upper page read process is performed at step 970. In one embodiment, upper page reading at step 970 includes the same method described in FIG. 18, which includes reading the flag and all three states since an unwritten upper page may be addressed for reading, or another reason.

Figure 20:
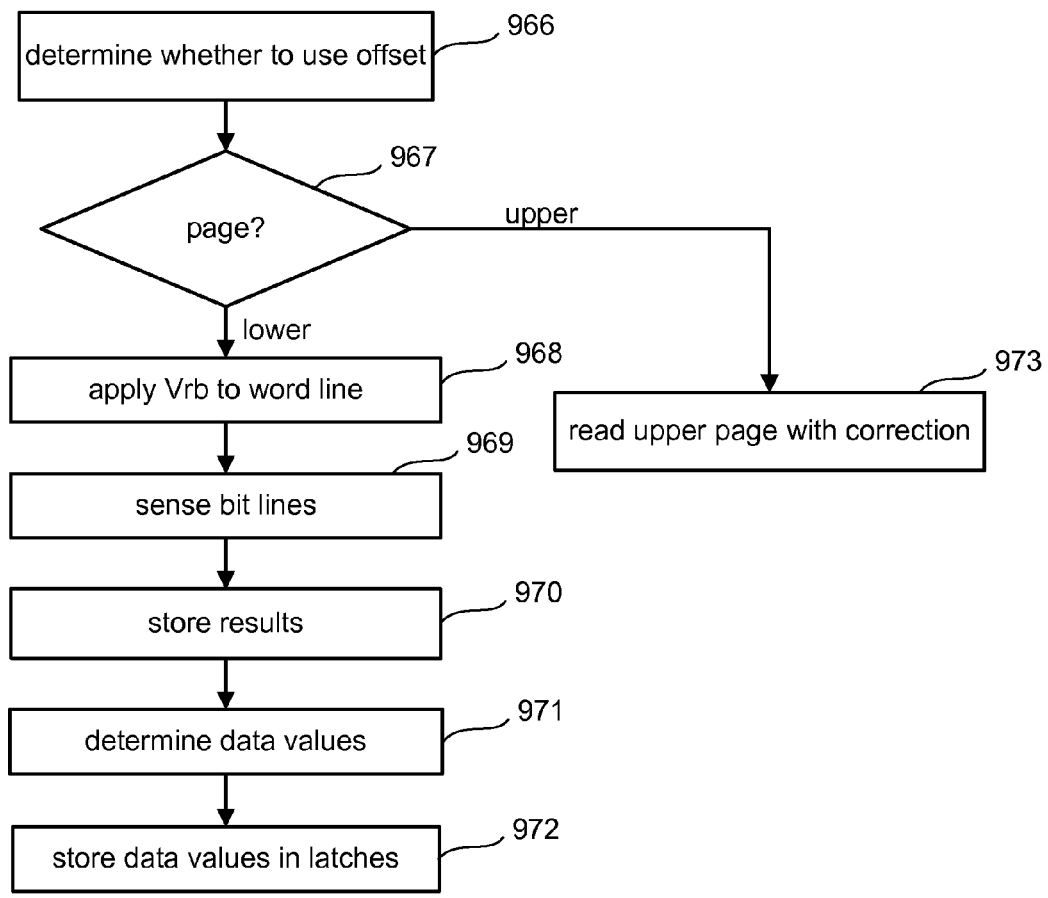
FIG. 20 is a flowchart describing one embodiment of a process for reading data while using compensation for floating gate coupling.

FIG. 20 is a flowchart describing one embodiment of a process for reading data while compensating for floating gate coupling, such as can be performed at step 906 of FIG. 17. It is determined at step 966 whether to use an offset to compensate for floating gate coupling. Step 966 is performed separately for each bit line. The data from the neighboring word lines is used to determine which bit lines need to use the offset. If a neighboring cell is in state E or B the memory cell at the word line being read does not need a compensation applied during sensing. If the cell at $WL_{n+1}$ is in state E, it hasn't contributed any coupling because its threshold voltage is the same as before the word line of interest was written. If a cell at $WL_{n+1}$ is in state B, it was programmed there from intermediate state B', which is a small change in charge and can be ignored in most situations. A read offset will be used for those cells on $WL_n$ having a neighboring memory cell at $WL_{n+1}$ in state A or state C.

If at step 967 it is determined the page being read is the lower page, Vrb is applied to the word line associated with the page being read at step 968. Reading at Vrb is sufficient to determine lower page data for the encoding shown in FIGS. 12A-12C. At step 969, the bit lines are sensed, and at step 970, the results are stored in the appropriate latches for the bit lines. As shown in FIG. 14, no compensation offsets are applied at the Vrb level so step 969 is the only lower page sensing performed. Because the cells are programmed to create a larger margin between state A and State B, an accurate read can be achieved without compensating for coupling. The data for the lower page is determined at step 971. If a cell turned on in response to Vrb, then the lower page data is 1; otherwise, the lower page data is 0. At step 972, the lower page data is stored in the appropriate latches for communication to the user.

Figure 21:
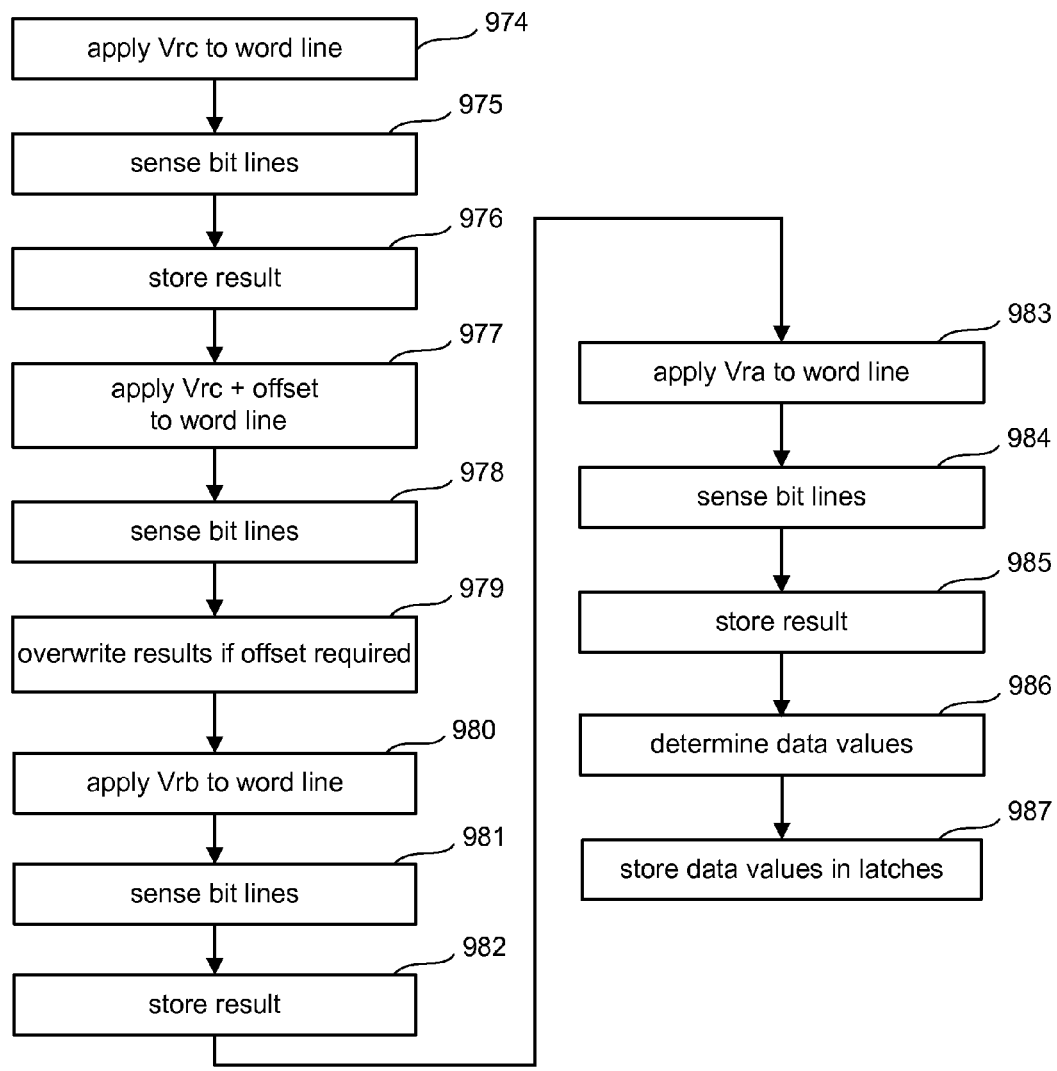
FIG. 21 is a flowchart describing one embodiment of a process for reading upper page data using compensation for floating gate coupling.

If it is determined at step 967 that the page being read is the upper page, the upper page is read using compensation at step 976. FIG. 21 is a flowchart describing an upper page read using offset read reference levels. At step 974 of FIG. 21, read reference voltage Vrc is applied to the word line associated with the page being read. The bit lines are sensed at step 975 and the results are stored in the appropriate latches at step 976. At step 977, Vrc plus an offset (e.g., 0.1V) is applied to the word line associated with the page being read. At step 978, the bit lines are sensed and at step 979, the results of sensing at step 978 are used to overwrite the results stored in step 976 for any bit line in which the offset is required. At step 980, Vrb is applied to the word line and at step 981, the bit lines are sensed. The results of sensing at step 981 are stored at step 982. Vra is applied to the word line associated with the page being read at step 983. The bit lines are sensed at step 984 and at step 985 the results are stored in the appropriate latches. In FIG. 20, the naturally occurring margin between state E and state A is assumed to be sufficient such that an offset associated with Vra is not necessary. In other embodiments, offsets for the Vra level can be used. The data values are determined at step 986 and at step 987, the data values are stored in the appropriate data latches for communication to the user. In other embodiments the order of reading (Vrc, Vrb, Vra) may be changed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile memory system, comprising:
 a plurality of non-volatile storage elements, capable of storing data in at least four physical states;
 managing circuitry in communication with said plurality of non-volatile storage elements, said managing circuitry receives a request to read a first non-volatile storage element and in response to said request, reads a second non-volatile storage element adjacent said first non-volatile storage element, said managing circuitry reads said first non-volatile storage element by applying a first reference to read said first non-volatile storage element at a level between a first programmed state and a second programmed state and applying a second reference to read said first non-volatile storage element at a level between said second programmed state and a third programmed state, said managing circuitry determines data of said first non-volatile storage element using a result of applying said first reference at a first level and a result of applying said second reference at a second level when said second non-volatile storage element is in a first subset of said physical states, said managing circuitry determines data of said first non-volatile storage element using a result of applying said first reference at said first level and a result of applying said second reference at a third level when said second non-volatile storage element is in a second subset of said physical states.

2. The non-volatile memory system of claim 1, wherein:
 applying said first reference at said first level does not compensate for floating gate coupling between said first non-volatile storage element and said second non-volatile storage element;
 applying said second reference at said second level does not compensate for floating gate coupling between said first non-volatile storage element and said second non-volatile storage element; and
 applying said second reference at said third level compensates for floating gate coupling between said first non-volatile storage element and said second non-volatile storage element.

3. The non-volatile memory system of claim 2, wherein said managing circuitry determines data of said first non-volatile storage element when said second non-volatile storage element is in said second subset of said physical states by:
 applying a first voltage corresponding to said first reference at said first level to a control gate of said first non-volatile storage element and sensing conduction of said first non-volatile storage element;
 applying a second voltage corresponding to said second reference at said second level to said control gate of said first non-volatile storage element and sensing conduction of said first non-volatile storage element;
 applying a third voltage corresponding to said second reference at said third level to said control gate of said first non-volatile storage element and sensing conduction of said first non-volatile storage element, said third voltage is equal to said second voltage plus an offset;

determining said data of said first non-volatile storage element by selecting said result of applying said first voltage, selecting said result of applying said third voltage, and disregarding said result of applying said second voltage.

4. The non-volatile memory system of claim 2, wherein: said offset is substantially equal to an apparent change in a threshold voltage of said first non-volatile storage element based on said floating gate coupling between said first non-volatile storage element and said second non-volatile storage element.

5. The non-volatile memory system of claim 1, wherein said first non-volatile storage element is part of a set of non-volatile storage elements coupled to a first word line, said managing circuitry programs said set of non-volatile storage elements to a plurality of physical states including said first programmed state, said second programmed state, and said third programmed state, said managing circuitry:
verifies whether non-volatile storage elements of said set to be programmed to said first state have reached a first target level corresponding to said first state;
verifies whether non-volatile storage elements of said set to be programmed to said second state have reached a second target level corresponding to said second state, said second target level spaced from said first target level by a first amount;
verifies whether non-volatile storage elements of said set to be programmed to said third state have reached a third target level corresponding to said third state, said third target level spaced from said second target level by a second amount smaller than said first amount.

6. The non-volatile memory system of claim 1, wherein: said first subset of physical states includes said first programmed state and said third programmed state; and said second subset of physical states includes said second programmed state and an erased state.

7. The non-volatile memory system of claim 6, wherein: said first programmed state is adjacent said erased state and said second programmed state; and said second programmed state is adjacent said first programmed state and said third programmed state.

8. The non-volatile memory system of claim 1, wherein: said second non-volatile storage element stores upper page data and lower page data;
reading said second non-volatile storage element in response to said request comprises reading said upper page data for said second non-volatile storage element;
said first and second levels for said second reference are based on said upper page data and not on said lower page data for said second non-volatile storage element; and
said first subset of physical states corresponds to said second non-volatile storage element storing first data for said upper page; and
said second subset of physical states corresponds to said second non-volatile storage element storing second data for said upper page.

9. The non-volatile memory system of claim 1, wherein: said first non-volatile storage element stores data for a first logical page and a second logical page;
said second non-volatile storage element stores data for a third logical page and a fourth logical page;
said data for said second logical page stored by said first non-volatile storage element is programmed after programming said data for said third logical page stored by said second non-volatile storage element and before programming said data stored for said fourth logical page by said second non-volatile storage element.

10. The non-volatile memory system of claim 1, wherein: said first non-volatile storage element is connected to a first word line;
said second non-volatile storage element is connected to a second word line adjacent said first world line;
wherein programming data for non-volatile storage elements connected to said first word line begins before programming data for non-volatile storage elements connected to said second word line begins.

11. The non-volatile memory system of claim 1, wherein: said first non-volatile storage element is a multi-state NAND flash memory device.

12. The non-volatile memory system of claim 1, wherein: said first non-volatile storage element is a multi-state NAND flash memory device.

13. The non-volatile memory system of claim 1, wherein: said first non-volatile storage element is part of an array of flash memory devices;
said array is removable from a host system.

* * * * *